US011329654B2

(12) United States Patent
Choi et al.

(10) Patent No.: US 11,329,654 B2
(45) Date of Patent: May 10, 2022

(54) DELAY CIRCUIT OF DELAY-LOCKED LOOP CIRCUIT AND DELAY-LOCKED LOOP CIRCUIT

(71) Applicant: SAMSUNG ELECTRONICS CO., LTD., Suwon-si (KR)

(72) Inventors: Hundae Choi, Hwaseong-si (KR); Garam Choi, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/149,039

(22) Filed: Jan. 14, 2021

(65) Prior Publication Data
US 2022/0006461 A1 Jan. 6, 2022

(30) Foreign Application Priority Data
Jul. 2, 2020 (KR) .......................... 10-2020-0081267

(51) Int. Cl.
*H03L 7/081* (2006.01)
*G11C 11/4076* (2006.01)

(52) U.S. Cl.
CPC ........ *H03L 7/0814* (2013.01); *G11C 11/4076* (2013.01); *H03L 7/0816* (2013.01); *H03L 7/0818* (2013.01)

(58) Field of Classification Search
CPC ... H03L 7/0814; H03L 7/0816; H03L 7/0818; G11C 11/4076
USPC .......................................................... 365/149
See application file for complete search history.

(56) References Cited

U.S. PATENT DOCUMENTS

| 6,489,823 | B2 | 12/2002 | Iwamoto |
| 7,116,148 | B2 | 10/2006 | Minzoni |
| 7,567,102 | B2 | 7/2009 | Lee |
| 7,583,119 | B2 | 9/2009 | Song |
| 8,149,034 | B2 | 4/2012 | Gomm |
| 8,547,153 | B2 | 10/2013 | Jung et al. |
| 8,803,577 | B2 | 8/2014 | Park et al. |
| 8,829,960 | B2 | 9/2014 | Na |
| 8,878,586 | B2 | 11/2014 | Kwak et al. |
| 9,614,533 | B2 | 4/2017 | Wei et al. |
| 9,614,534 | B1 | 4/2017 | Shi |
| 10,840,917 | B1* | 11/2020 | Cali ...................... H03L 7/0814 |
| 2006/0176090 | A1 | 8/2006 | Gower et al. |
| 2007/0171760 | A1* | 7/2007 | Gomm ................... G11C 29/02 |
| | | | 365/189.15 |

(Continued)

OTHER PUBLICATIONS

Taiwanese Office action dated Sep. 3, 2021.

*Primary Examiner* — Fernando Hidalgo
(74) *Attorney, Agent, or Firm* — Lee IP Law, PC

(57) ABSTRACT

A delay circuit of a delay-locked loop (DLL) circuit includes: a phase splitter configured to split a phase of a reference clock signal to output a first reference clock signal and a second reference clock signal having a phase difference of 180 degrees; a logic gate configured to delay the second reference clock signal to output a delayed reference clock signal; and a delay line circuit including a plurality of delay cells that are cascade-connected, the delay line circuit configured to delay the first reference clock signal and the delayed reference clock signal based on a control code set, and to output a first delayed clock signal and a second delayed clock signal having a delay amount corresponding to a delay of one logic gate included in the plurality of delay cells.

20 Claims, 21 Drawing Sheets

(56) References Cited

U.S. PATENT DOCUMENTS

| | | | |
|---|---|---|---|
| 2010/0090736 A1* | 4/2010 | Kim | H03L 7/07 |
| | | | 327/158 |
| 2011/0109357 A1* | 5/2011 | Kim | H03L 7/0816 |
| | | | 327/158 |
| 2014/0225651 A1 | 8/2014 | Haerle et al. | |
| 2016/0028409 A1* | 1/2016 | Yoshizawa | H03L 7/0816 |
| | | | 327/158 |
| 2017/0005782 A1* | 1/2017 | Im | H03L 7/0814 |
| 2018/0048319 A1* | 2/2018 | Chae | H03L 7/0816 |
| 2021/0287731 A1* | 9/2021 | Oh | H03L 7/0812 |

* cited by examiner

DELAY CIRCUIT OF DELAY-LOCKED LOOP CIRCUIT AND DELAY-LOCKED LOOP CIRCUIT

CROSS-REFERENCE TO RELATED APPLICATION

Korean Patent Application No. 10-2020-0081267, filed on Jul. 2, 2020, in the Korean Intellectual Property Office, and entitled: "Delay Circuit of Delay-Locked Loop Circuit and Delay-Locked Loop Circuit," is incorporated by reference herein in its entirety.

BACKGROUND

1. Field

Embodiments relate to a delay circuit of a delay-locked loop circuit, and a delay-locked loop circuit.

2. Description of the Related Art

A semiconductor device may operate in synchronization with a clock, e.g., a clock applied from the outside. When the externally applied clock is used in the semiconductor device, a time delay (or a clock skew) may occur, e.g., due to an internal circuit of the semiconductor device. A delay-locked loop (DLL) may be used to compensate for the time delay, such that the semiconductor device is synchronized with the externally applied clock.

SUMMARY

Embodiments are directed to a delay circuit of a delay-locked loop (DLL) circuit, the delay circuit including: a phase splitter configured to split a phase of a reference clock signal to output a first reference clock signal and a second reference clock signal having a phase difference of 180 degrees; a logic gate configured to delay the second reference clock signal to output a delayed reference clock signal; and a delay line circuit including a plurality of delay cells that are cascade-connected, the delay line circuit configured to delay the first reference clock signal and the delayed reference clock signal based on a control code set, and to output a first delayed clock signal and a second delayed clock signal having a delay amount corresponding to a delay of one logic gate included in the plurality of delay cells.

Embodiments are also directed to a delay-locked loop (DLL) circuit of a semiconductor memory device, the DLL circuit including a first delay circuit configured to delay a reference clock signal based on a first control code set to generate a first delayed clock signal and a second delayed clock signal; a second delay circuit configured to finely adjust a delay amount of the first delayed clock signal and the second delayed clock signal based on a second control code set to generate a first delayed output clock signal; a clock pass circuit configured to delay the first delayed output clock signal to generate an output clock signal having a same phase as a phase of the reference clock signal; a replica circuit configured to delay the first delayed output clock signal to generate a feedback clock signal; and a first delay controller configured to adjust code values of the first control code set based on a first phase difference between the reference clock signal and the feedback clock signal, detected during a first interval, and configured to provide the first control code set to the first delay circuit. The first delay circuit may include: a phase splitter configured to split a phase of the reference clock signal to output a first reference clock signal and a second reference clock signal having a phase difference of 180 degree; a logic gate configured to delay the second reference clock signal to output a delayed reference clock signal; and a delay line circuit including a plurality of delay cells that are cascade-connected, the delay line circuit configured to delay the first reference clock signal and the delayed reference clock signal based on the first control code set, and to output the first delayed clock signal and the second delayed clock signal having a delay amount corresponding to a delay of one logic gate included in the plurality of delay cells.

Embodiments are also directed to a delay circuit of a delay-locked loop (DLL) circuit, the delay circuit including: a phase splitter configured to split a phase of a reference clock signal to output a first reference clock signal and a second reference clock signal having a phase difference of 180 degree; a logic gate configured to delay the second reference clock signal to output a delayed reference clock signal; and a delay line circuit including a plurality of delay cells that are cascaded-connected, the delay line circuit configured to delay the first reference clock signal and the delayed reference clock signal based on a control code set, and to output a first delayed clock signal and a second delayed clock signal having a delay amount corresponding to a delay of one logic gate included in the plurality of delay cells. The plurality of delay cells may include first through k-th delay cells that are cascade-connected in series, each of the first through k-th delay cells having a same configuration, k being a natural number equal to or greater than two, the first delay cell may be configured to determine a sub-delay amount of the first reference clock signal and the delayed reference clock signal, and to determine whether to transfer the first reference clock signal and the delayed reference clock signal to the second delay cell based on a first control code of the control code set, and each of the first through k-th delay cells may include first through twelfth NAND gates, and are configured to adjust the delay amount between the first delayed clock signal and the second delayed clock signal to be the same as a delay amount between the first reference clock signal and the delayed reference clock signal.

BRIEF DESCRIPTION OF THE DRAWINGS

Features will become apparent to those of skill in the art by describing in detail example embodiments with reference to the attached drawings in which.

DETAILED DESCRIPTION

Figure 1:
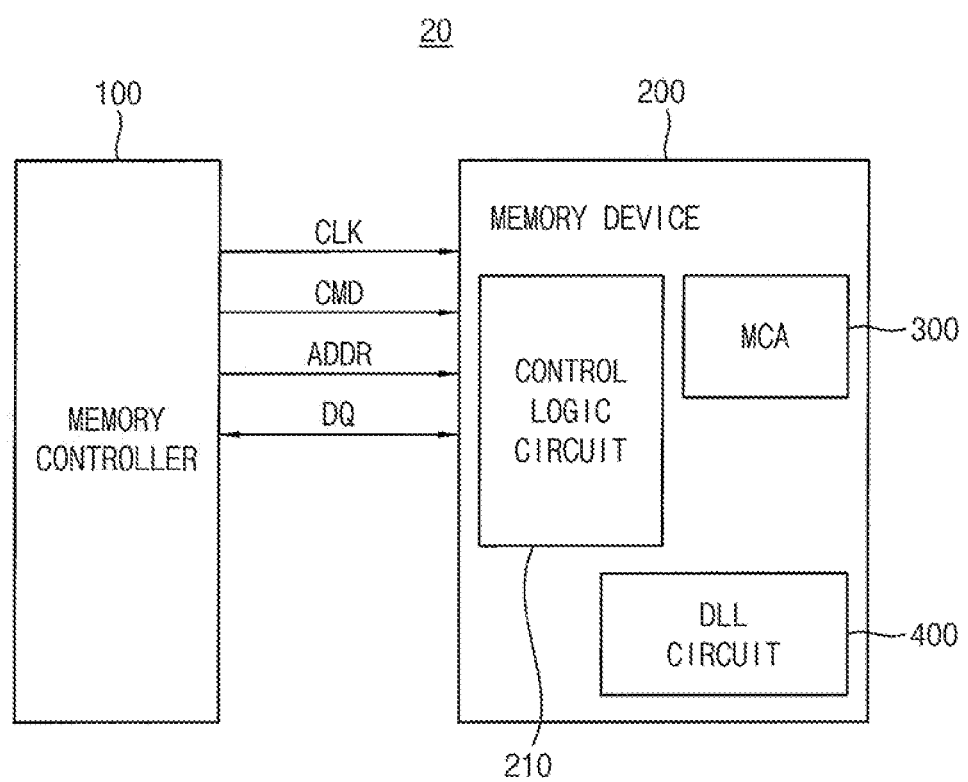
FIG. 1 is a block diagram illustrating a memory system according to example embodiments.

FIG. 1 is a block diagram illustrating a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host.

In addition, the memory controller 100 may issue operation commands to the semiconductor memory device 200 for controlling the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, or a LPDDR5 SDRAM.

The memory controller 100 may transmit a clock signal CLK, a command CMD, and an address (signal) ADDR to the semiconductor memory device 200, and exchange data DQ with the semiconductor memory device 200.

The semiconductor memory device 200 may include a memory cell array 300 that stores the data DQ, a control logic circuit 210, and a delay-locked loop (DLL) circuit 400.

In an example embodiment, the DLL circuit 400 generates a first delayed clock signal (CLKF, described below) and a second delayed clock signal (CLKS, described below) based on a reference clock signal (REFCLK, described below), which is based on the clock signal CLK. The DLL circuit 400 generates an output clock signal having a same phase as a phase of the reference clock signal (REFCLK) by reducing a delay amount between the first delayed clock signal (CLKF) and the second delayed clock signal (CLKS). The control logic circuit 210 controls an access to the memory cell array 300 based on the command CMD and the address ADDR, and controls an operation of the DLL circuit 400.

Figure 2:
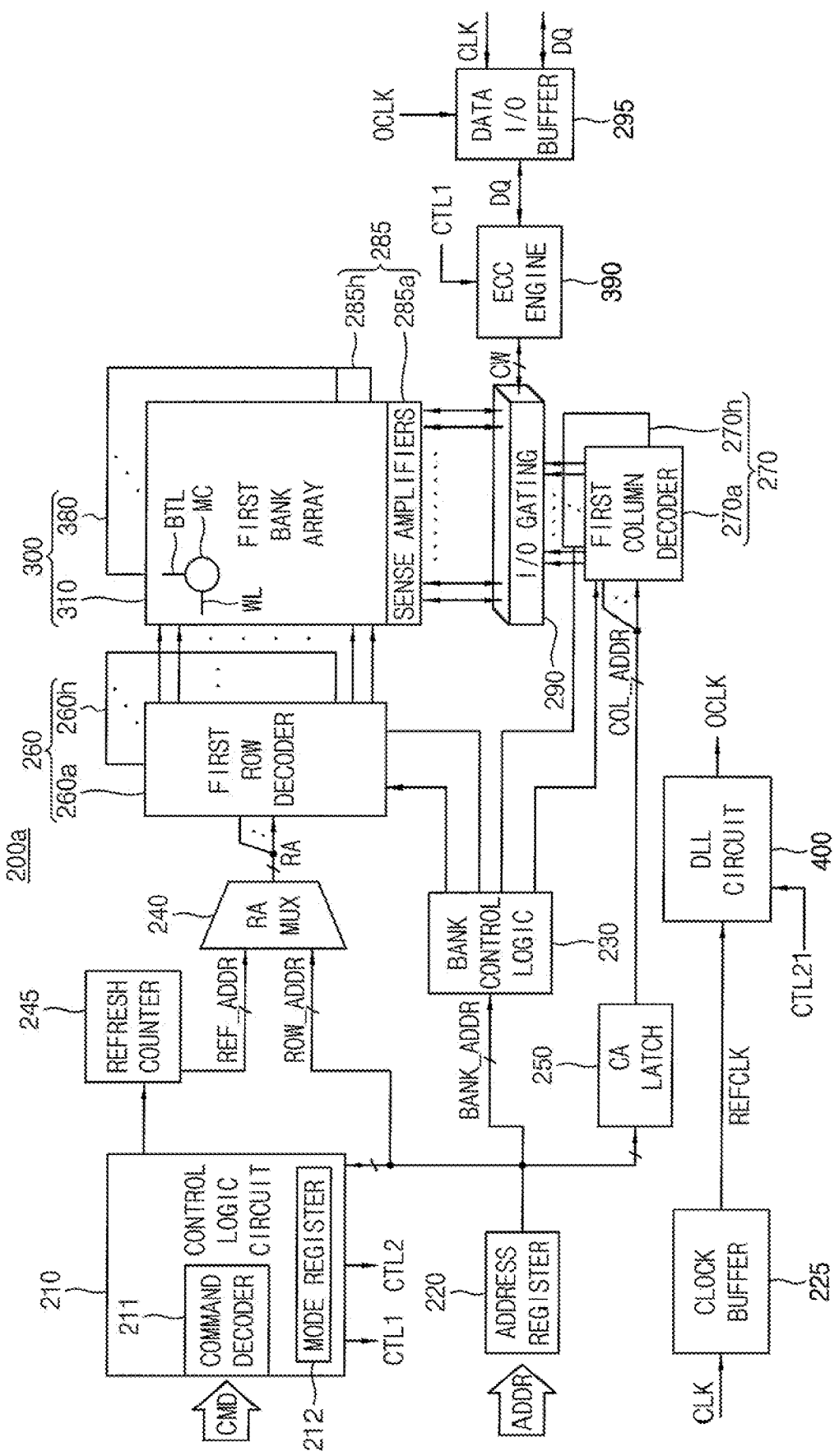
FIG. 2 is a block diagram illustrating the semiconductor memory device in FIG. 1 according to example embodiments.

FIG. 2 is a block diagram illustrating the semiconductor memory device in FIG. 1 according to example embodiments.

Referring to FIG. 2, the semiconductor memory device 200a may include the control logic circuit 210, an address register 220, a clock buffer 225, a bank control logic 230, a row address multiplexer 240, a refresh counter 245, a column address latch 250, a row decoder 260, a column decoder 270, a sense amplifier unit 285, an I/O gating circuit 290, a data I/O buffer 295, the memory cell array 300, an error correction code (ECC) engine 390, and the DLL circuit 400.

The memory cell array 300 may include first through eighth bank arrays 310~380, the row decoder 260 may include first through eighth bank row decoders 260a~260h respectively coupled to the first through eighth bank arrays 310~380, the column decoder 270 may include first through eighth bank column decoders 270a~270h respectively coupled to the first through eighth bank arrays 310~380, and the sense amplifier unit 285 may include first through eighth bank sense amplifiers 285a~285h respectively coupled to the first through eighth bank arrays 310~380. The first through eighth bank arrays 310~380, the first through eighth bank row decoders 260a~260h, the first through eighth bank column decoders 270a~270h, and the first through eighth bank sense amplifiers 285a~285h may form first through eighth banks.

Each of the first through eighth bank arrays 310~380 may include a plurality of memory cells MC, formed at intersections of a plurality of word-lines WL and a plurality of bit-line BTL.

The address register 220 may receive the address ADDR including a bank address BANK_ADDR, a row address ROW_ADDR, and a column address COL_ADDR from the memory controller 100. The address register 220 may provide the received bank address BANK_ADDR to the bank control logic 230, provide the received row address ROW_ADDR to the row address multiplexer 240, and provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The refresh counter 245 may sequentially output the refresh row address REF_ADDR under control of the control logic circuit 210.

The activated one of the first through eighth bank row decoders 260a~260h (activated by the bank control logic 230) may decode the row address RA that is output from the row address multiplexer 240, and activate a word-line corresponding to the row address RA. For example, the activated bank row decoder may apply a word-line driving voltage to the word-line corresponding to the row address.

The column address latch 250 may receive the column address COL_ADDR from the address register 220, and temporarily store the received column address COL_ADDR. In some example embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may activate a sense amplifier corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the first through eighth bank arrays 310~380, and write drivers for writing data to the first through eighth bank arrays 310~380.

A codeword CW that is read from one bank array of the first through eighth bank arrays 310~380 may be sensed by a sense amplifier coupled to the one bank array from which the data is to be read, and may be stored in the read data latches. The codeword CW stored in the read data latches may be provided to the memory controller 100 via the data I/O buffer 295 after ECC decoding is performed on the codeword CW by the ECC engine 390.

The data DQ to be written in one bank array of the first through eighth bank arrays 310~380 may be provided to the data I/O buffer 295 from the memory controller 100, and may be provided to the ECC engine 390 from the data I/O buffer 295. The ECC engine 390 may perform an ECC encoding on the data DQ to generate parity bits, the ECC engine 390 may provide the data DQ and the parity bits to the I/O gating circuit 290, and the I/O gating circuit 290 may write the data DQ and the parity bits in a sub-page in one bank array through the write drivers.

The data I/O buffer 295 may provide the data DQ from the memory controller 100 to the ECC engine 390 in a write operation of the semiconductor memory device 200, based on the clock signal CLK, and may provide the data DQ from the ECC engine 390 to the memory controller 100 in a read operation of the semiconductor memory device 200, based on an output clock signal OCLK provided from the DLL circuit 400.

The ECC engine 390 may perform an ECC encoding and an ECC decoding on the data DQ based on a first control signal CTL1 from the control logic circuit 210. The clock buffer 225 may receive the clock signal CLK, and may provide a reference clock signal REFCLK.

The DLL circuit 400 may receive the reference clock signal REFCLK, and may split a phase of the reference clock signal REFCLK to generate a first reference clock signal (INd, described below) and a second reference clock signal (INb, described below). The DLL circuit 400 may delay the first reference clock signal (INd) and the second reference clock signal (INb) to generate a first delayed clock signal (CLKF) and a second delayed clock signal (CLKS) having a delay amount corresponding to a delay amount of one logic gate. The DLL circuit 400 may adjust finely delay of the first delayed clock signal (CLKF) and the second delayed clock signal (CLKS) to generate an output clock signal OCLK, and may provide the output clock signal OCLK to the data I/O buffer 295. The DLL circuit 400 may operate in response to a second control signal CTL21, which may be received from the control logic circuit 210.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211 that decodes the command CMD received from the memory controller 100, and may include a mode register 212 that sets an operation mode of the semiconductor memory device 200.

The command decoder 211 may generate the control signals corresponding to the command CMD by decoding a write enable signal, a row address strobe signal, a column address strobe signal, a chip select signal, etc. The control logic circuit 210 may generate the first control signal CTL1 to control the ECC engine 390, and may generate the second control signal CTL21 to control the DLL circuit 400.

Figure 3:
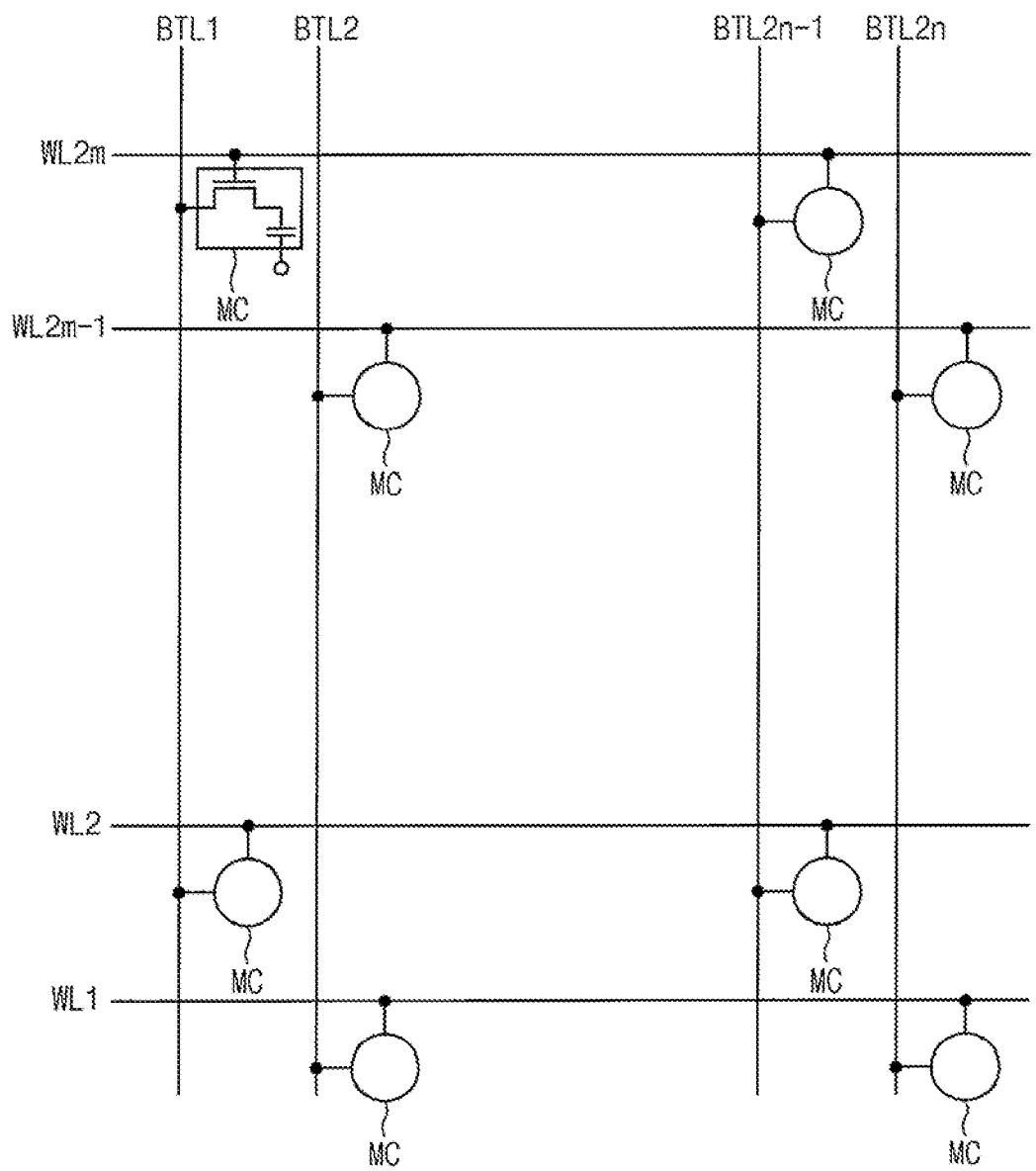
FIG. 3 illustrates an example of the first bank array in the semiconductor memory device of FIG. 2.

FIG. 3 illustrates an example of the first bank array in the semiconductor memory device of FIG. 2.

Referring to FIG. 3, the first bank array 310 may include a plurality of word-lines WL1~WLm (m is a natural number greater than two), a plurality of bit-lines BTL1~BTLn (n is a natural number greater than two), and a plurality of memory cells MCs disposed at intersections between the word-lines WL1~WLm and the bit-lines BTL1~BTLn. Each of the memory cells MCs may include a cell transistor coupled to each of the word-lines WL1~WLm and each of the bit-lines BTL1~BTLn, and a cell capacitor coupled to the cell transistor.

The word-lines WL1~WLm coupled to the plurality of memory cells MCs may be referred to as rows of the first bank array 310. The bit-lines BTL1~BTLn coupled to the plurality of memory cells MCs may be referred to as columns of the first bank array 310.

Figure 4:
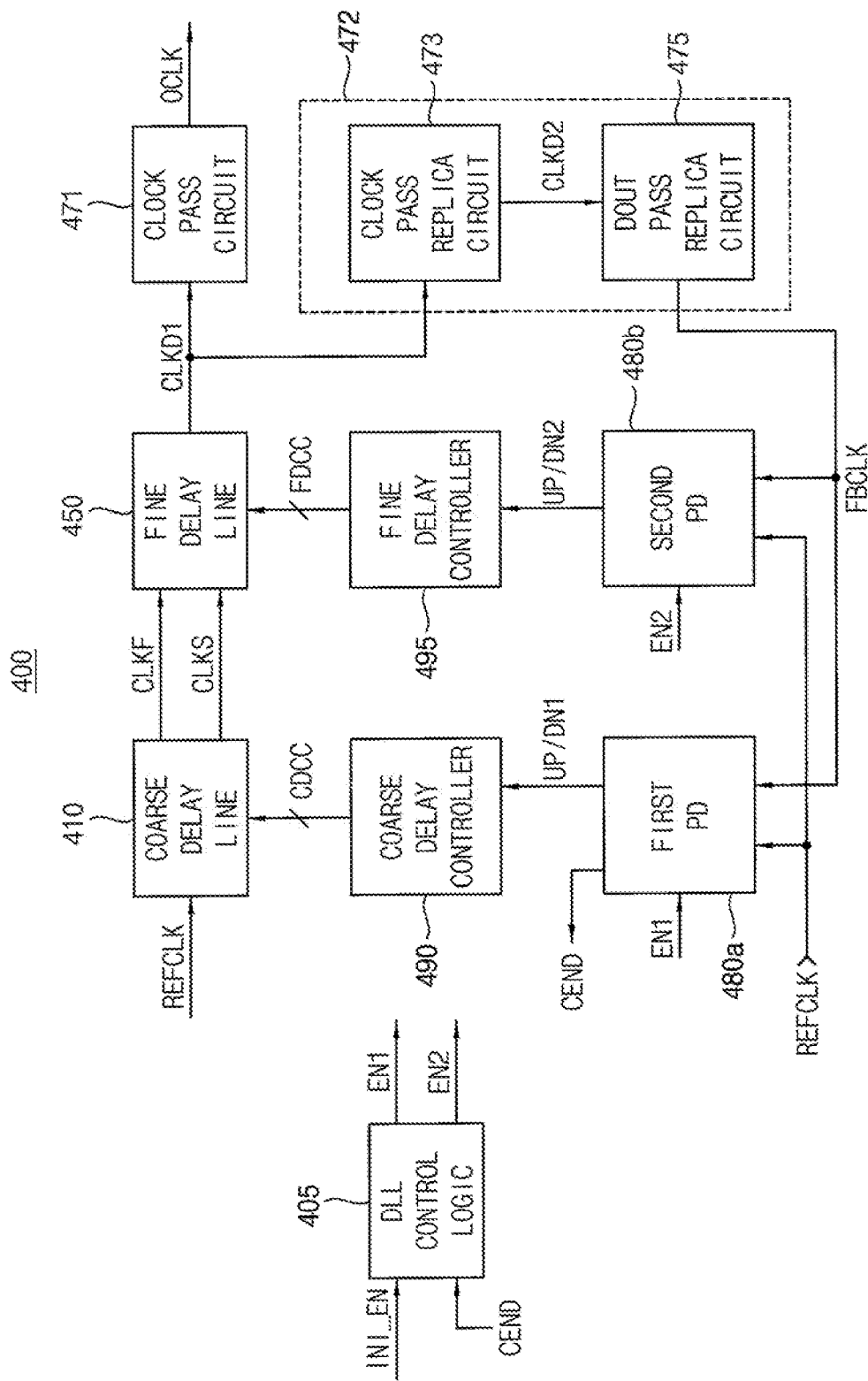
FIG. 4 is a block diagram illustrating an example of the DLL circuit in the semiconductor memory device of FIG. 2 according to example embodiments.

FIG. 4 is a block diagram illustrating an example of the DLL circuit 400 in the semiconductor memory device of FIG. 2 according to example embodiments.

Referring to FIG. 4, the DLL circuit 400 may include a DLL control logic 405, a coarse delay line 410, a fine delay line 450, a clock pass circuit 471, a replica circuit 472, a first phase detector 480a, a second phase detector 480b, a coarse delay controller 490, and a fine delay controller 495.

The replica circuit 472 may include a clock pass replica circuit 473 and a data (DOUT) pass replica circuit 475.

Hereinafter, the coarse delay line 410 may be referred to as a first delay circuit, the fine delay line 450 may be referred to as a second delay circuit, the coarse delay controller 490 may be referred to a first delay controller, and the fine delay controller 495 may be referred to as a second delay controller.

The first delay circuit 410 may delay the reference clock signal REFCLK based on a first control code set CDCC, and may generate a first delayed clock signal CLKF and a second delayed clock signal CLKS. The second delay circuit 450 may finely adjust a delay amount of the first delayed clock CLKF signal and the second delayed clock signal CLKS based on a second control code set FDCC, and may generate a first delayed output clock signal CLKD1.

The clock pass circuit 471 may delay the first delayed output clock signal CLKD1 to generate an output clock signal OCLK having a same phase as a phase of the reference clock signal REFCLK.

The replica circuit 472 may delay the first delayed output clock signal CLKD1 to generate a feedback clock signal FBCLK.

For example, the clock pass replica circuit 473 may provide a delay amount that is the same as a delay amount of the clock buffer 225, and may delay the first delayed output clock signal CLKD1 to generate a second delayed output signal CLKD2. The data pass replica circuit 475 may provide a delay amount that is the same as a delay amount of the data input/output buffer 295, and may delay the second delayed output clock signal CLKD2 to generate the feedback clock signal FBCLK.

The first phase detector 480a may detect a first phase difference between the reference clock signal REFCLK and the feedback clock signal FBCLK during a first interval, and may provide the first delay controller 490 with a first up/down signal UP/DN1 corresponding to the first phase difference, in response to a first enable signal EN1. The first phase detector 480a may be enabled during the first interval in response to the first enable signal EN1. In addition, the first phase detector 480a may provide the DLL control logic 405 with an end signal CEND indicating an ending of the adjusting operation of the first delay controller 490 in response to a predetermined time interval elapsing.

The second phase detector 480b may detect a second phase difference between the reference clock signal REFCLK and the feedback clock signal FBCLK during a second interval different from the first interval, and may provide the second delay controller 495 with a second up/down signal UP/DN2 corresponding to the second phase difference, in response to a second enable signal EN2. The second phase detector 480b may be enabled during the second interval in response to the second enable signal EN2.

The first delay controller 490 may adjust code values of the first control code set CDCC based on the first up/down signal UP/DN1, and may provide the first control code set CDCC (for coarsely adjusting a delay amount of the first delay circuit 410) to the first delay circuit 410. The second delay controller 495 may adjust code values of the second control code set FDCC based on the second up/down signal UP/DN2, and may provide the second control code set FDCC (for finely adjusting a delay amount of the second delay circuit 450) to the second delay circuit 450.

The DLL control logic 405 may determine logic levels of the first enable signal EN1 and the second enable signal EN2 based on an initializing enable signal INI_EN. The DLL control logic 405 may activate the first enable signal EN1 during the first period and deactivate the second enable signal EN2 when the initializing enable signal INI_EN is activated. The DLL control logic 405 may deactivate the first enable signal EN1 and activate the second enable signal EN2 during the second period in response to activation of the end signal CEND. The initializing enable signal INI_EN may be included in the second control signal CTL21 in FIG. 2.

Figure 5:
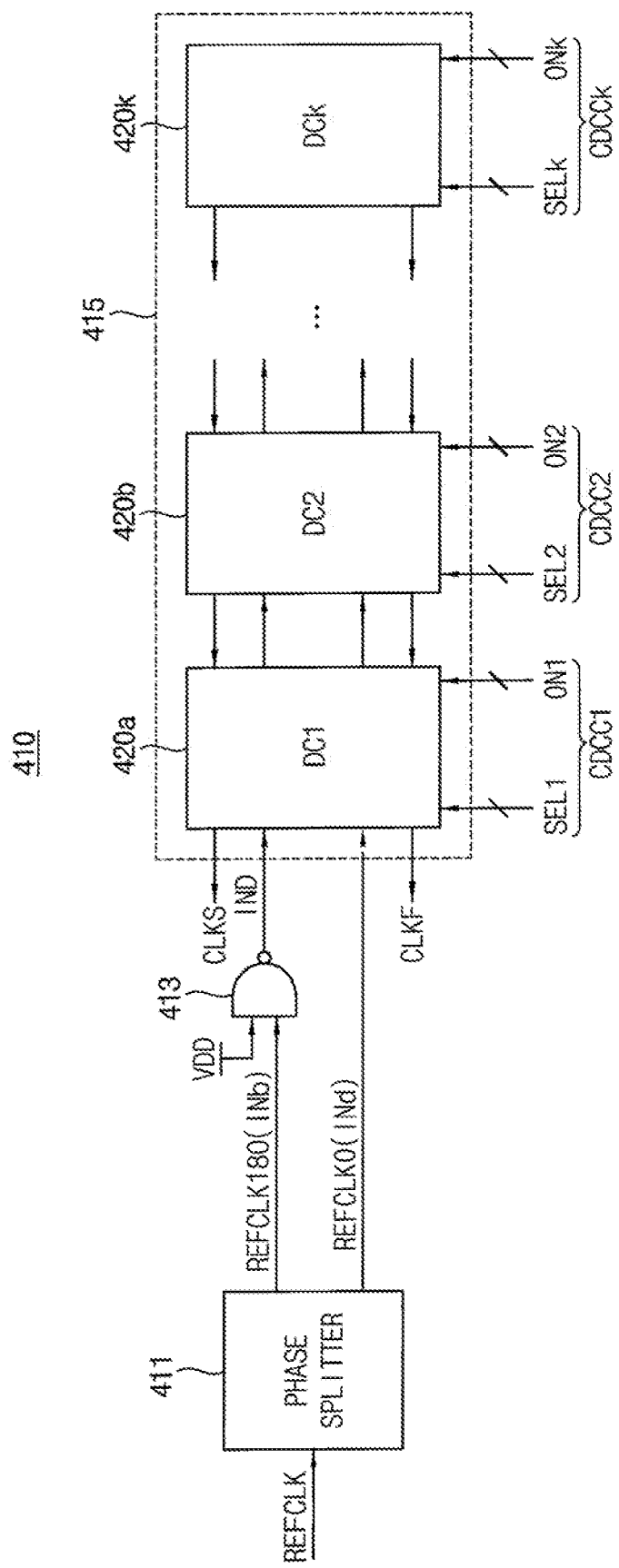
FIG. 5 is a block diagram illustrating an example of the first delay circuit in the DLL circuit of FIG. 4 according to example embodiments.

FIG. 5 is a block diagram illustrating an example of the first delay circuit (coarse delay line) 410 in the DLL circuit of FIG. 4 according to example embodiments.

Referring to FIG. 5, the first delay circuit 410 may include a phase splitter 411, a logic gate 413, and a delay line circuit 415.

The phase splitter 411 may receive the reference clock signal REFCLK, and may split a phase of the reference clock signal REFCLK to output a first reference clock signal REFCLK0=INd and a second reference clock signal REFCLK180=INb having a phase difference of 180 degrees.

The logic gate 413 may include a NAND gate, and may perform a NAND operation on the second reference clock signal INb and a power supply voltage VDD to output a delayed reference clock signal IND. Thus, the logic gate 413 may delay the second reference clock signal INb to output the delayed reference clock signal IND.

The delay line circuit 415 may include a plurality of cascade-connected delay cells (DC1, DC2, . . . , DCk) 420a, 420b, . . . , 420k (k is a natural number equal to or greater than three). The plurality of cascade-connected delay cells 420a, 420b, . . . , 420k may be referred to as first through k-th delay cells.

The plurality of delay cells 420a, 420b, . . . , 420k may delay the first reference clock signal INd and the delayed reference clock signal IND based on the control code set CDCC to output the first delayed clock signal CLKF and the second delayed clock signal CLKS having a delay amount corresponding to a delay amount of one logic gate included in each of the plurality of delay cells 420a, 420b, . . . , 420k.

The first delay cell 420a may receive a first control code CDCC1 including selection control bits SEL1 and transfer control bits ON1. The second delay cell 420b may receive a second control code CDCC2 including selection control bits SEL2 and transfer control bits ON2. The k-th delay cell 420k may receive a k-th control code CDCCk including selection control bits SELk and transfer control bits ONk.

Figure 6:
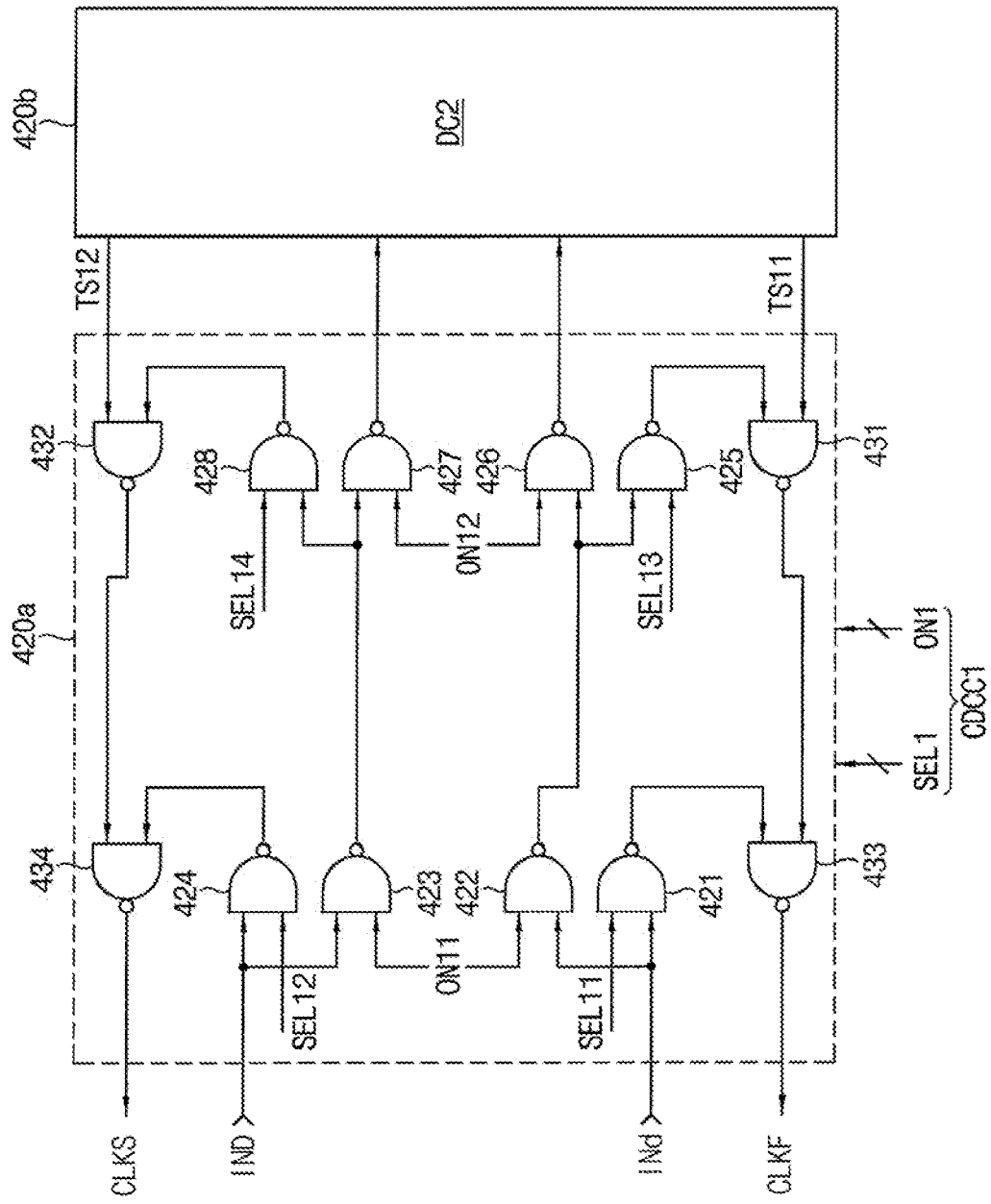
FIG. 6 is a circuit diagram illustrating an example of the first delay cell of the plurality of delay cells in FIG. 5 according to example embodiments.

FIG. 6 is a circuit diagram illustrating an example of the first delay cell of the plurality of delay cells in FIG. 5 according to example embodiments.

Each of the delay cells 420b, . . . , 420k may have a same configuration as a configuration of the first delay cell 420a. Thus, the plurality of delay cells 420a, 420b, . . . , 420k may have a same configuration with respect to one another.

Referring to FIG. 6, the first delay cell 420a may include first through eight NAND gates 421~428 and ninth through twelfth NAND gates 431~434.

In FIG. 6, the selection control bits SEL1 may include first through fourth selection control bits SEL11, SEL12, SEL13, and SEL14, and the transfer control bits ON1 may include first and second transfer control bits ON11 and ON 12.

In the present example embodiment, the first NAND gate 421 performs a NAND operation on the first reference clock signal INd and the first selection control bit SEL11. The second NAND gate 422 performs a NAND operation on the first reference clock signal INd and the first transfer control bit ON11. The third NAND gate 423 performs a NAND operation on the delayed reference clock signal IND and the first transfer control bit ON11. The fourth NAND gate 424 performs a NAND operation on the delayed reference clock signal IND and the second selection control bit SEL12.

The fifth NAND gate 425 performs a NAND operation on an output of the second NAND gate 422 and the third selection control bit SEL13. The sixth NAND gate 426 performs a NAND operation on the output of the second NAND gate 422 and the second transfer control bit ON12, and provides the second delay cell 420b with a result of the NAND operation of the sixth NAND gate 426. The seventh NAND gate 427 performs a NAND operation on an output of the third NAND gate 423 and the second transfer control bit ON12, and provides the second delay cell 420b with a result of the NAND operation of the seventh NAND gate 427. The eighth NAND gate 428 performs a NAND operation on the output of the third NAND gate 423 and the fourth selection control bit SEL14.

The ninth NAND gate 431 performs a NAND operation on an output of the fifth NAND gate 425 and a first transfer signal TS11 from the second delay cell 420b. The tenth NAND gate 432 performs a NAND operation on an output of the eight NAND gate 428 and a second transfer signal TS12 from the second delay cell 420b. The eleventh NAND gate 433 performs a NAND operation on an output of the first NAND gate 421 and an output of the ninth NAND gate 431 to output the first delayed clock signal CLKF. The twelfth NAND gate 434 performs a NAND operation on an output of the fourth NAND gate 424 and an output of the tenth NAND gate 432 to output the second delayed clock signal CLKS.

The first through fourth selection control bits SEL11, SEL12, SEL13, and SEL14 and the first transfer control bit ON11 may determine a sub-delay amount of the first delay cell 420a.

When the first and second selection control bits SEL11 and SEL12 have a high level and the first transfer control bit ON11 has a low level, the sub-delay amount of the first delay cell 420a may correspond to a delay amount of two NAND gates. When the first and second selection control bits SEL11 and SEL12 have a low level, the first transfer control bit ON11 has a high level, the third and fourth selection control bits SEL13 and SEL14 have a high level and the second transfer control bit ON12 has a low level, the sub-delay amount of the first delay cell 420a may correspond to a delay amount of four NAND gates. Thus, the first NAND gate 424, the fourth NAND gate 424, the fifth NAND gate 425, and the eighth NAND gate 428 may determine the sub-delay amount based on the first through fourth selection control bits SEL11, SEL12, SEL13, and SEL14.

The second transfer control bit ON12 may determine whether to transfer the first reference clock signal INd and the delayed reference clock signal IND to the second delay cell 420b. Thus, when the second transfer control bit ON12 has a high level, the sixth NAND gate 426 may transfer the output of the second NAND gate 422 to the second delay cell 420b, and the seventh NAND gate 427 may transfer the output of the third NAND gate 423 to the second delay cell 420b. When the second transfer control bit ON12 has a low level, the sixth NAND gate 426 may not transfer the output of the second NAND gate 422 to the second delay cell 420b, and the seventh NAND gate 427 may not transfer the output of the third NAND gate 423 to the second delay cell 420b. Thus, the sixth NAND gate 426 and the seventh NAND gate 427 may selectively transfer the first reference clock signal INd and the delayed reference clock signal IND to the second delay cell 420b based on the second transfer control bit ON12, respectively.

As described above, the first and second selection control bits SEL11 and SEL12 may be either activated or deactivated as one set, and the third and fourth selection control bits SEL13 and SEL14 may be either activated or deactivated as one set. Therefore, as an amount of delay to be adjusted increases, bits to be activated among the first through k-th selection control bits SEL1~SELk increase by two bits, and one bit from the first through k-th transfer control bits ON1~ONk may be activated.

Figure 7:
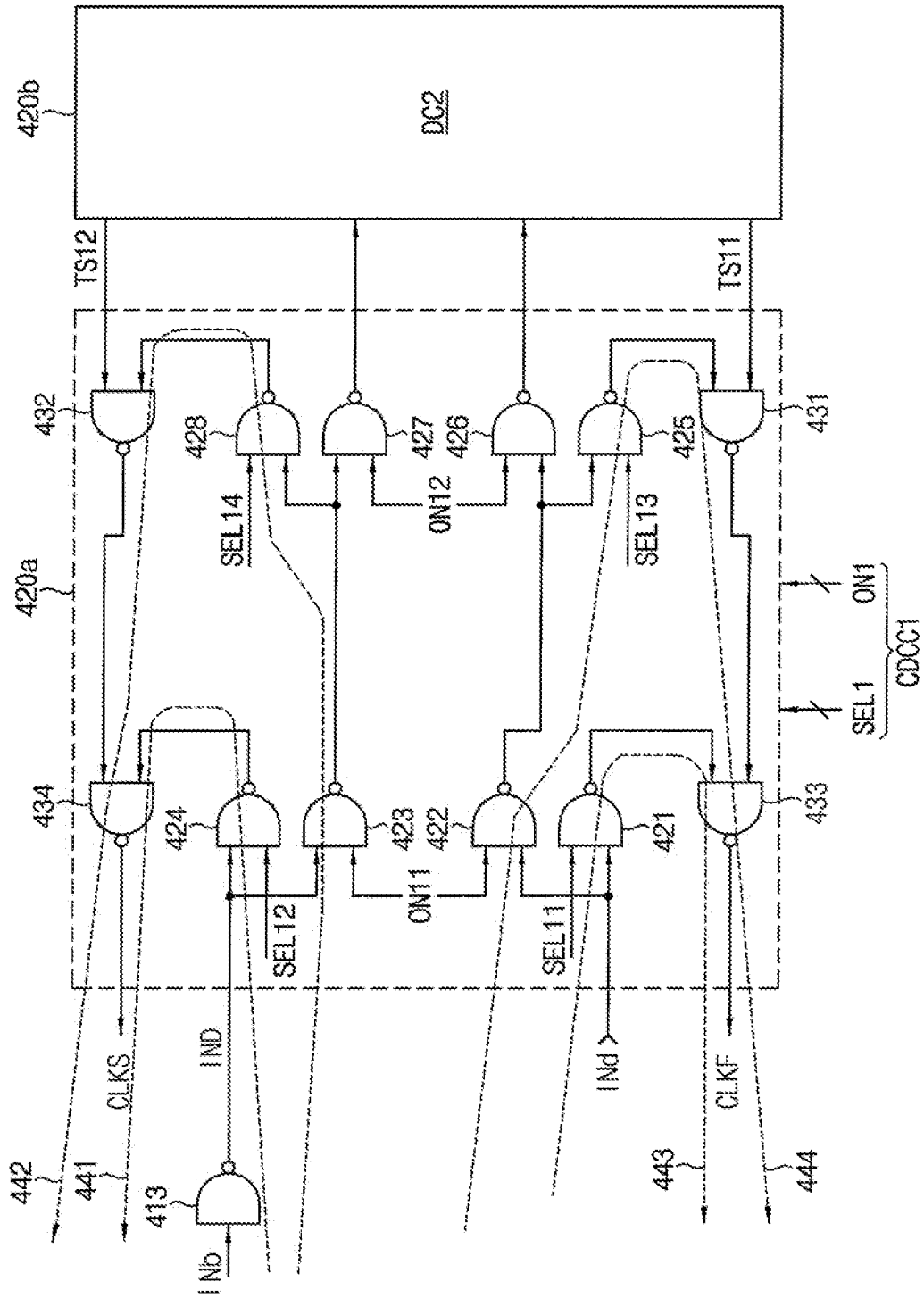
FIG. 7 illustrates delay paths of the first reference clock signal and the second reference clock signal in the first delay circuit in FIG. 5.

FIG. 7 illustrates delay paths of the first reference clock signal and the second reference clock signal in the first delay circuit in FIG. 5.

In FIG. 7, it is assumed that the second transfer control bit ON12 has a low level.

Referring to FIGS. 5 through 7, when the first and second selection control bits SEL11 and SEL12 have a high level and the first transfer control bit ON11 has a low level, the first reference clock signal INd is delayed by two NAND gates 421 and 433, and is provided as the first delayed clock signal CLKF (as indicated by reference numeral 443), and the second reference clock signal INb is delayed by three NAND gates 413, 424, and 434, and is provided as the second delayed clock signal CLKS (as indicated by reference numeral 441).

When the first and second selection control bits SEL11 and SEL12 have a low level, the first transfer control bit ON11 has a high level, and the third and fourth selection control bits SEL13 and SEL14 have a high level, the first reference clock signal INd is delayed by four NAND gates 422, 425, 431, and 433, and is provided as the first delayed clock signal CLKF (as indicated by reference numeral 444), and the second reference clock signal INb is delayed by five NAND gates 413, 423, 428, 432, and 434, and is provided as the second delayed clock signal CLKS (as indicated by reference numeral 442).

The delayed reference clock signal IND is delayed by a delay amount of one NAND gate (i.e., NAND gate 413) with respect to the first reference clock signal INd. In addition, the delay amount between the first delayed clock signal CLKF and the second delayed clock signal CLKS is substantially the same as a delay amount between the first reference clock signal INd and the delayed reference clock signal IND. The second delayed clock signal CLKS has a phase that is delayed by the delay amount with respect to a phase of the first delayed clock signal CLKF. This will now be explained in further detail.

Figure 8:
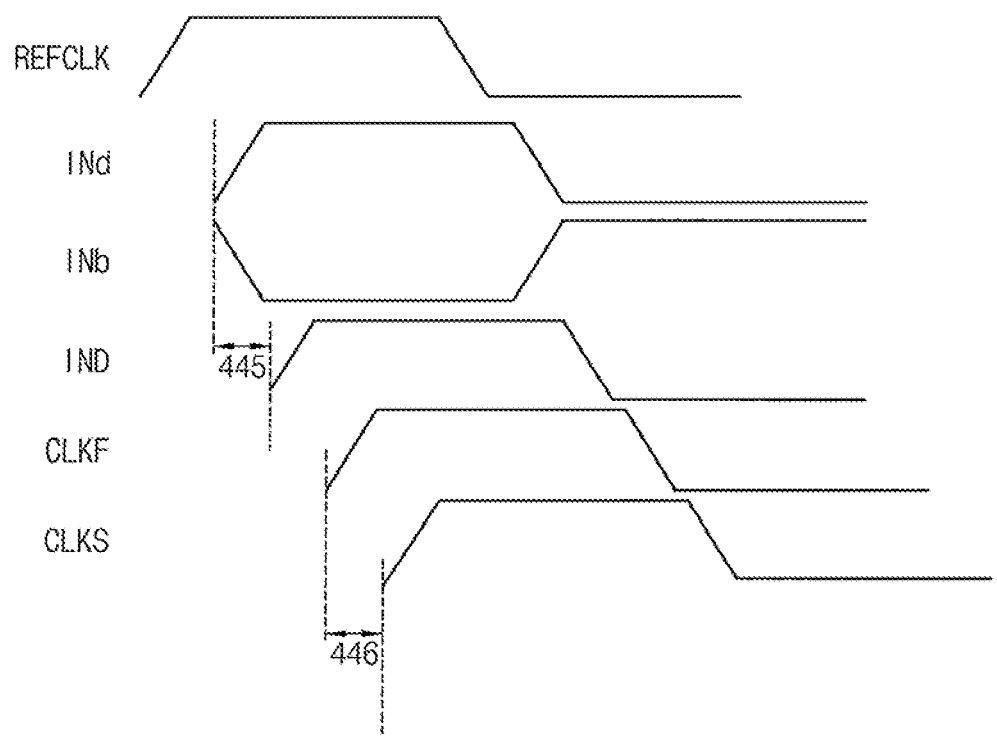
FIG. 8 illustrates waveforms of various clock signals in the first delay circuit in FIG. 5.

FIG. 8 illustrates waveforms of various clock signals in the first delay circuit in FIG. 5.

Referring to FIGS. 5 through 8, the phase splitter 411 splits a phase of the reference clock signal REFCLK to output the first reference clock signal INd and the second reference clock signal INb, which have a phase difference of 180 degrees from each other. The NAND gate 413 inverts and delays the second reference clock signal INb to output the delayed reference clock signal IND. Therefore, the first reference clock signal INd and the delayed reference clock signal IND have a phase difference corresponding to a delay amount 445.

The plurality of delay cells 420a, 420b, . . . , 420k delay the second reference clock signal INd and the delayed reference clock signal IND to output the first delayed clock signal CLKF and the second delayed clock signal CLKS. The first delayed clock signal CLKF and the second delayed clock signal CLKS have a phase difference corresponding to a delay amount 446.

As described with reference to FIGS. 6 and 7, the delay amount 445 may be the same as the delay amount 446, and may correspond to a delay amount of one NAND gate.

Figure 9:
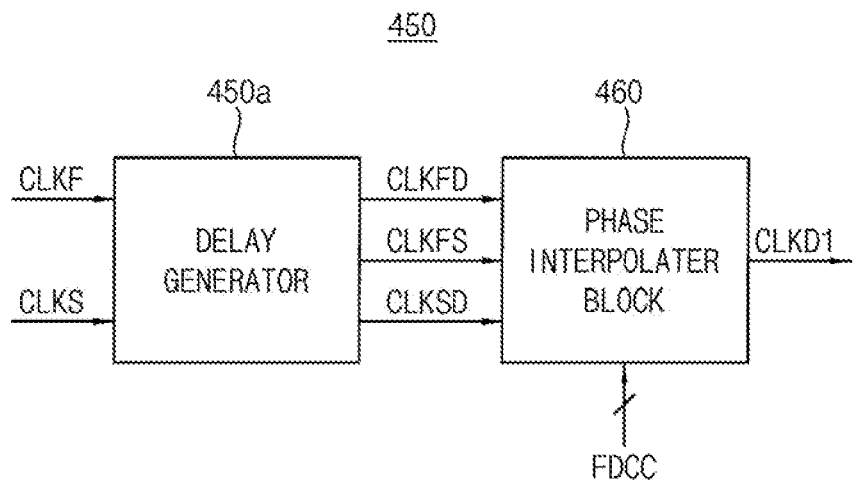
FIG. 9 is a block diagram illustrating an example of the second delay circuit in the DLL circuit of FIG. 4 according to example embodiments.

FIG. 9 is a block diagram illustrating an example of the second delay circuit (fine delay line) 450 in the DLL circuit of FIG. 4 according to example embodiments.

Referring to FIG. 9, the second delay circuit 450 may include a delayed clock signal generator (delay generator) 450a and a phase interpolator block 460.

The delayed clock signal generator 450a may delay the first delayed clock signal CLKF and the second delayed clock signal CLKS to generate first through third sub-delayed clock signals CLKFD, CLKFS, and CLKSD. The phase interpolator block 460 may finely adjust delay amounts of the first through third sub-delayed clock signals CLKFD, CLKFS, and CLKSD based on the second control code set FDCC to output the first delayed output clock signal CLKD1. For example, the phase interpolator block 460 may divide each phase of the first through third sub-delayed clock signals CLKFD, CLKFS, and CLKSD, and may interpolate the divided phases to output the first delayed output clock signal CLKD1, in response to the second control code set FDCC.

Figure 10:
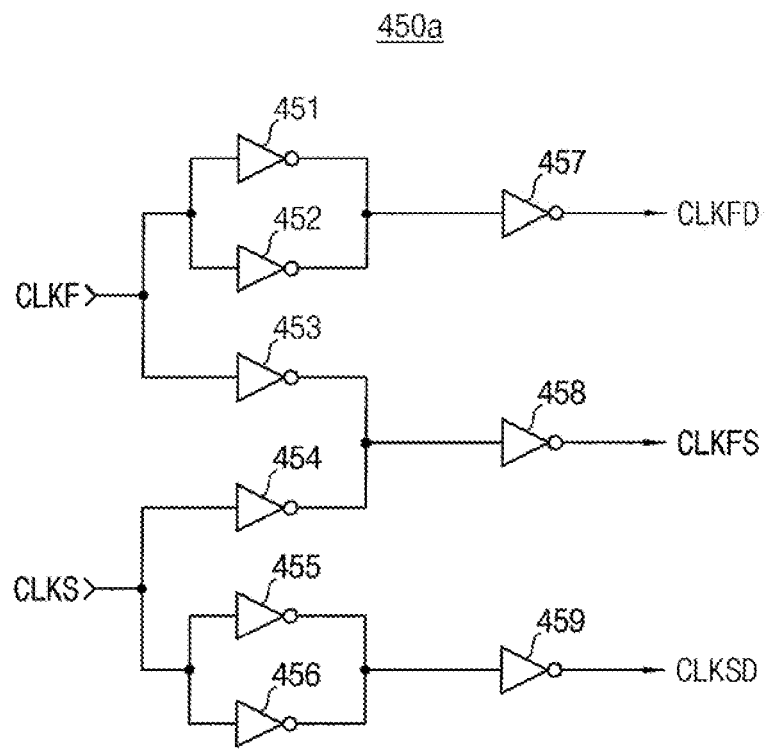
FIG. 10 is a block diagram illustrating an example of the delayed clock signal generator in the second delay circuit of FIG. 9 according to example embodiments.

FIG. 10 is a block diagram illustrating an example of the delayed clock signal generator 450a in the second delay circuit of FIG. 9 according to example embodiments.

Referring to FIG. 10, the delayed clock signal generator 450a may include a plurality of inverters 451~459.

In the present example embodiment, each of the inverters 451, 452, and 453 inverts the first delayed clock signal CLKF. Each of the inverters 454, 455, and 456 inverts the second delayed clock signal CLKS. The inverter 457 inverts outputs of the inverters 451 and 452 to output the first sub-delayed clock signal CLKFD. The inverter 458 inverts outputs of the inverters 453 and 454 to output the second sub-delayed clock signal CLKFS. The inverter 459 inverts outputs of the inverters 455 and 456 to output the third sub-delayed clock signal CLKSD.

Therefore, the first sub-delayed clock signal CLKFD is delayed by a delay amount of two inverters with respect to the first delayed clock signal CLKF. The second sub-delayed clock signal CLKFS is delayed by a delay amount corresponding to sum of a delay amount of two inverters and a delay amount between the first delayed clock signal CLKK and the second delayed clock signal CLKS with respect to the first delayed clock signal CLKF. The third sub-delayed clock signal CLKDD is delayed by a delay amount of two inverters with respect to the second delayed clock signal CLKS.

Figure 11:
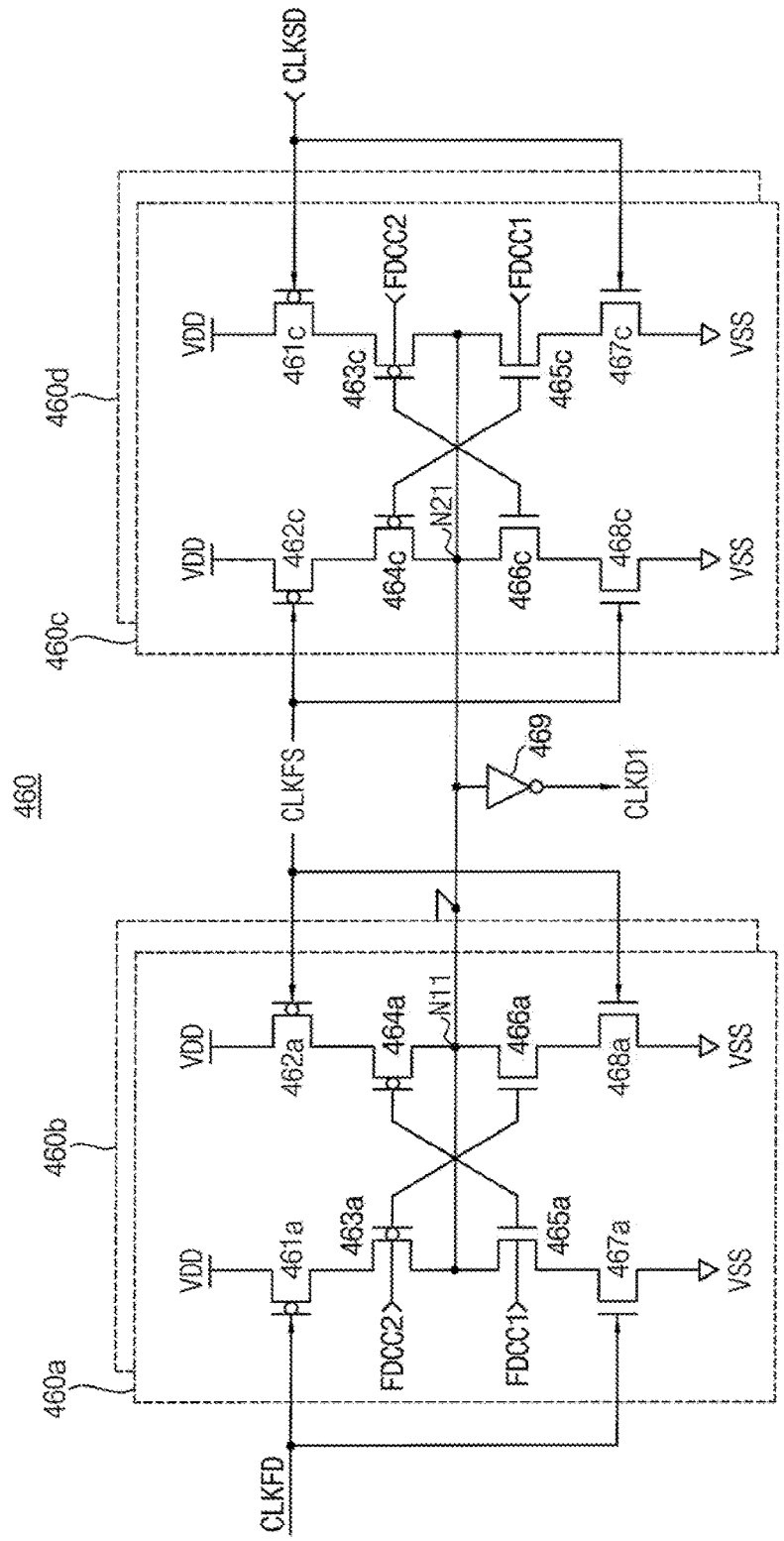
FIG. 11 is a block diagram illustrating an example of the phase interpolator block in the second delay circuit of FIG. 9 according to example embodiments.

FIG. 11 is a block diagram illustrating an example of the phase interpolator block 460 in the second delay circuit of FIG. 9 according to example embodiments.

Referring to FIG. 11, the phase interpolator block 460 may include a plurality of phase interpolators 460a, 460b, 460c, and 460d, and an inverter 469.

The phase interpolator 460a may include p-channel metal-oxide semiconductor (PMOS) transistors 461a~464a and n-channel metal-oxide semiconductor (NMOS) transistors 465a~468a. In the present example embodiment, the PMOS transistors 461a and 463a and the NMOS transistors 465a and 467a are cascade-connected between the power supply voltage VDD and a ground voltage VSS, and the PMOS transistors 462a and 464a and the NMOS transistors 466a and 468a are cascade-connected between the power supply voltage VDD and the ground voltage VSS.

Gates of the PMOS transistor 461a and the NMOS transistor 467a receive the first sub-delayed clock signal CLKFD. Gates of the PMOS transistor 462a and the NMOS transistor 468a receive the second sub-delayed clock signal CLKFS. Gates of the PMOS transistor 463a and the NMOS transistor 466a receive a second control bit FDCC2 of the second control code set FDCC. Gates of the PMOS transistor 464a and the NMOS transistor 465a receive a first control bit FDCC1 of the second control code set FDCC. The PMOS transistor 464a and the NMOS transistor 466a may be connected to each other at a node N11.

A configuration of the phase interpolator 460b may be the same as a configuration of the phase interpolator 460a.

The phase interpolator 460c may include PMOS transistors 461c~464c and NMOS transistors 465c~468c. In the present example embodiment, the PMOS transistors 461c and 463c and the NMOS transistors 465c and 467c are cascade-connected between the power supply voltage VDD and the ground voltage VSS, and the PMOS transistors 462c and 464c and the NMOS transistors 466c and 468c are cascade-connected between the power supply voltage VDD and the ground voltage VSS.

Gates of the PMOS transistor 461c and the NMOS transistor 467c receive the third sub-delayed clock signal CLKSD. Gates of the PMOS transistor 462c and the NMOS transistor 468c receive the second sub-delayed clock signal CLKFS. Gates of the PMOS transistor 463c and the NMOS transistor 466c receive the second control bit FDCC2 of the second control code set FDCC. Gates of the PMOS transistor 464c and the NMOS transistor 465c receive the first control bit FDCC1 of the second control code set FDCC. The PMOS transistor 464c and the NMOS transistor 466c may be connected to each other at a node N21.

A configuration of the phase interpolator 460d may be the same as a configuration of the phase interpolator 460c.

In the present example embodiment, the node N11 and the node N21 are coupled to each other, and the inverter 469 averages voltage levels of the node N11 and the node N21 to output the first delayed output clock signal CLKD1.

The phase interpolators 460a, 460b, 460c, and 460d may divide each phase of the first through third sub-delayed clock signals CLKFD, CLKFS, and CLKSD, and may interpolate the divided phases to output the first delayed output clock signal CLKD1, in response to the second control code set FDCC.

Figure 12:
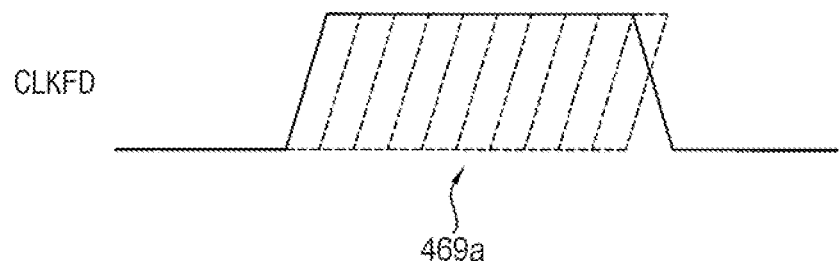
FIG. 12 illustrates an operation of the phase interpolator block in FIG. 11.

FIG. 12 illustrates an operation of the phase interpolator block 460 in FIG. 11.

Referring to FIG. 12, as described with reference to FIG. 11, the phase interpolators 460a, 460b, 460c, and 460d may divide the first sub-delayed clock signals CLKFD (as indicated by reference numeral 469a), and may interpolate the divided phases to output the first delayed output clock signal CLKD1, in response to the second control code set FDCC.

Figure 13:
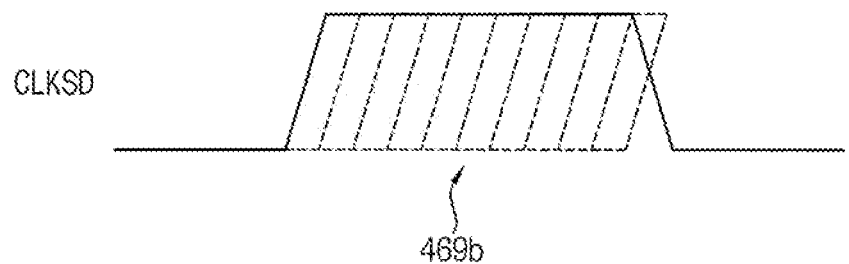
FIG. 13 illustrates an operation of the phase interpolator block in FIG. 11.

FIG. 13 illustrates another operation of the phase interpolator block 460 in FIG. 11.

Referring to FIG. 13, as described with reference to FIG. 11, the phase interpolators 460a, 460b, 460c, and 460d may divide the second sub-delayed clock signals CLKSD (as indicated by reference numeral 469b), and may interpolate the divided phases to output the first delayed output clock signal CLKD1, in response to the second control code set FDCC.

Figure 14:
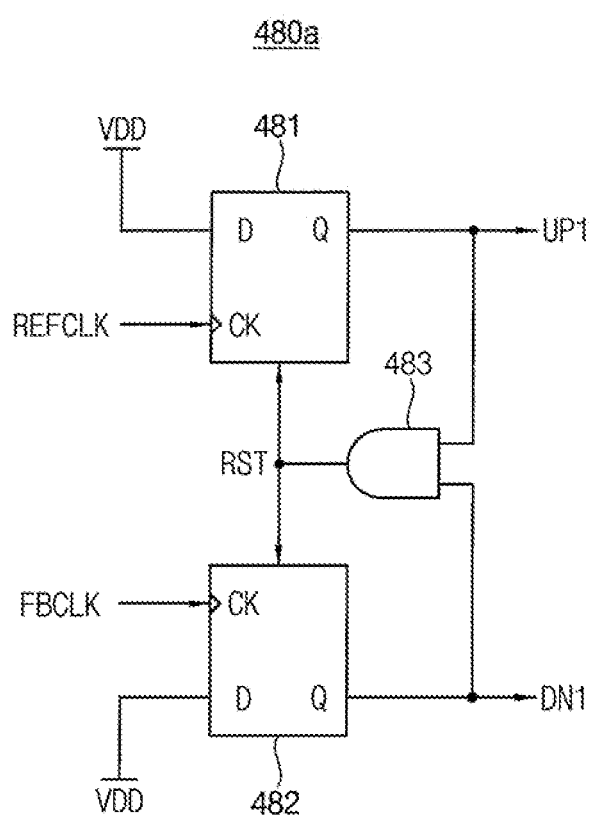
FIG. 14 is a block diagram illustrating an example of the first phase detector in the DLL circuit of FIG. 4 according to example embodiments.

FIG. 14 is a block diagram illustrating an example of the first phase detector 480a in the DLL circuit of FIG. 4 according to example embodiments.

Referring to FIG. 14, the first phase detector 480a may include a first flip-flop 481, a second flip-flop 482, and an AND gate 483.

The first flip-flop 481 may be synchronized with the reference clock signal REFCLK. The second flip-flop 482 may be synchronized with the feedback clock signal FBCLK.

A data input D of each of the first and second flip-flops 481 and 482 may be connected to the power supply voltage VDD. Thus, the data input D may be connected to a logic "1". The first flip-flop 481 may output an output Q as logic "1" at a rising edge of the reference clock signal REFCLK. The second first flip-flop 482 may output an output Q as logic "1" at a rising edge of the feedback clock signal FBCLK. The output Q of the first flip-flop 481 may become a first up signal UP1 and the output Q of the second flip-flop 482 may become a first down signal DN1.

The AND gate 483 may perform an AND operation on the output Q of the first flip-flop 481 and the output Q of the second flip-flop 482, and may output a reset signal RST. The reset signal RST may be provided to the first and second flip-flops 481 and 482.

When a phase of the reference clock signal REFCLK is earlier than a phase of the feedback clock signal FBCLK, the first up signal UP1 may become logic "1" from the rising edge of the reference clock signal REFCLK and may become logic "0" from the rising edge of the feedback clock signal FBCLK. Similarly, when a phase of the feedback clock signal FBCLK is earlier than a phase of the reference clock signal REFCLK, the first down signal DN1 may become logic "1" from the rising edge of the feedback clock signal FBCLK and may become logic "0" from the rising edge of the reference clock signal REFCLK.

Thus, when a phase of the reference clock signal REFCLK is earlier than a phase of the feedback clock signal FBCLK, the first up signal UP1 may become logic "1" only in a section between from the rising edge of the reference clock signal REFCLK to the rising edge of the feedback clock signal FBCLK. When a phase of the feedback clock signal FBCLK is earlier than a phase of the reference clock signal REFCLK, the first down signal DN1 may become logic "1" only in a section between from the rising edge of the feedback clock signal FBCLK to the rising edge of the reference clock signal REFCLK.

The first delay circuit 410 in the DLL circuit 400 may delay the first reference clock signal INd and the delayed reference clock signal IND based on the first control code set CDCC to generate the first delayed clock signal CLKF and the second delayed clock signal CLKS, which have a delay amount corresponding to a delay amount of one NAND gate, and may decrease a delay amount between the first delayed clock signal CLKF and the second delayed clock signal CLKS. Therefore, the first delay circuit 410 may decrease bang-bang jitter that occurs after coarse lock of the DLL circuit 400.

Figure 15:
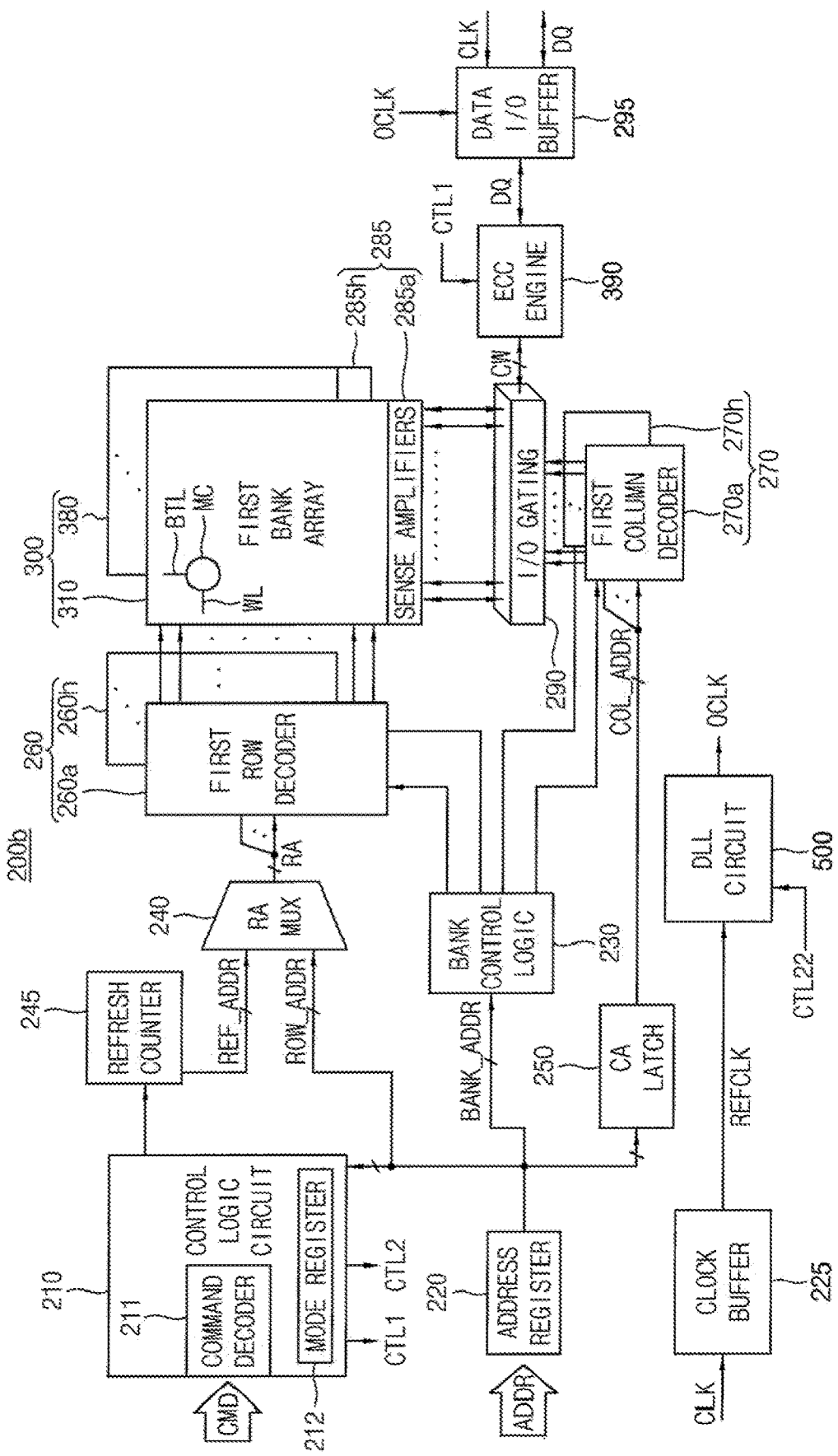
FIG. 15 is a block diagram illustrating an example of the semiconductor memory device in FIG. 1 according to example embodiments.

FIG. 15 is a block diagram illustrating an example of the semiconductor memory device in FIG. 1 according to example embodiments.

Referring to FIG. 15, the semiconductor memory device 200b may include the control logic circuit 210, the address register 220, the clock buffer 225, the bank control logic 230, the row address multiplexer 240, the refresh counter 245, the column address latch 250, the row decoder 260, the column decoder 270, the sense amplifier unit 285, the I/O gating circuit 290, the data I/O buffer 295, the memory cell array 300, the error correction code (ECC) engine 390, and a DLL circuit 500.

The semiconductor memory device 200b differs from the semiconductor memory device 200a in that the semiconductor memory device 200b includes the DLL circuit 500 instead of the DLL circuit 400, and the DLL circuit 500 is controlled in response to a second control signal CTL22.

Figure 16:
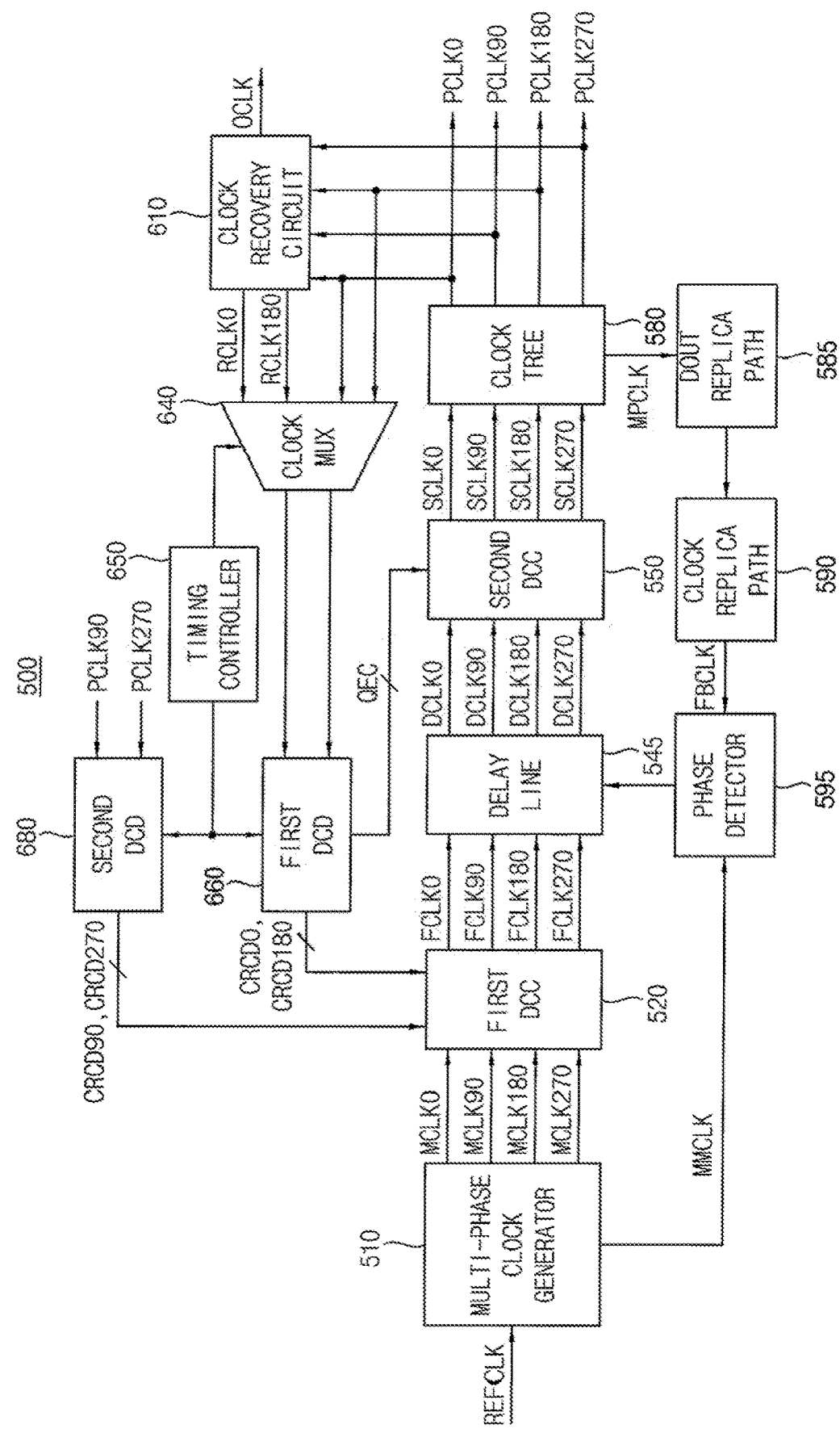
FIG. 16 is a block diagram illustrating an example of the DLL circuit in the semiconductor memory device of FIG. 15 according to example embodiments.

FIG. 16 is a block diagram illustrating an example of the DLL circuit 500 in the semiconductor memory device of FIG. 15 according to example embodiments.

Referring to FIG. 16, the DLL circuit 500 may include a multi-phase clock generator 510, a first duty cycle corrector (DCC) 520, a delay line 545, a second DCC 550, a clock tree 580, a clock recovery circuit 610, a clock multiplexer 640, a timing controller 650, a first duty cycle detector (DCD) 660, and a second DCD 680. The DLL circuit 500 may further include a data replica path 585, a clock replica path 590, and a phase detector 595.

The multi-phase clock generator 510 may receive the reference clock signal REFCLK, and may divide a frequency of the reference clock signal REFCLK to generate first through fourth divided clock signals MCLK0, MCLK90, MCLK180, and MCLK270, which have a phase difference of 90 degrees with respect to each other. A frequency of each of the first through fourth divided clock signals MCLK0, MCLK90, MCLK180, and MCLK270 may be a half of a frequency of the reference clock signal REFCLK.

The first DCC 520, in response to first correction codes CRCD0, CRCD90, CRCD180, and CRCD270, may correct duty errors of at least some of the first through fourth divided clock signals MCLK0, MCLK90, MCLK180, and MCLK270 to provide the first through fourth corrected clock signals FCLK0, FCLK90, FCLK180, and FCLK270.

The delay line 545 may delay at least some of the first through fourth corrected clock signals FCLK0, FCLK90, FCLK180, and FCLK270 to provide first through fourth delayed clock signals DCLK0, DCLK90, DCLK180, and DCLK270.

The second DCC 550, in response to a second correction code QEC, may adjust delays of at least some of the second through fourth delayed clock signals DCLK90, DCLK180, and DCLK270 of the first through fourth delayed clock signals DCLK0, DCLK90, DCLK180, and DCLK270 to provide first through fourth source clock signals SCLK0, SCLK90, SCLK180, and SCLK270.

The clock tree 580 may provide the first through fourth source clock signals SCLK0, SCLK90, SCLK180, and SCLK270 to an inside of the semiconductor memory device 200 as first through fourth propagation clock signals PCLK0, PCLK90, PCLK180, and PCLK270.

The data replica path 585 may provide a delay that is substantially the same as a delay of the data I/O buffer 295. The clock replica path 590 may provide a delay that is substantially the same as a delay of the clock buffer 430. The data replica path 585 and the clock replica path 590 may delay an averaged propagation clock signal MPCLK provided from the clock tree 580 to provide a feedback clock signal FBCLK to the phase detector 595.

The phase detector 595 may detect a phase difference between an averaged divided clock signal MMCLK and the averaged propagation clock signal MPCLK, and may adjust an amount of delay of the delay line 545. The multi-phase clock generator 510 may provide the averaged divided clock signal MMCLK to the phase detector 595.

The clock recovery circuit 610 may receive the first through fourth propagation clock signals PCLK0, PCLK90, PCLK180, and PCLK270, may generate first and second recovered clock signal RCLK0 and RCLK180 based on the first through fourth propagation clock signals PCLK0, PCLK90, PCLK180, and PCLK270, and may output one of the first and second recovered clock signal RCLK0 and RCLK180 as the output clock signal OCLK.

The clock multiplexer 640 may receive a first pair (including the first and second recovered clock signal RCLK0 and RCLK180) and a second pair (including the first and third propagation clock signals PCLK0 and PCLK180), and may select one of the first pair and the second pair according to a control of the timing controller 650 to output the selected pair to the first DCD 660.

The first DCD 660 may detect duty errors of the first and third propagation clock signals PCLK0 and PCLK180, may generate first and third sub correction codes CRCD0 and CRCD180 based on the detected duty errors, and may detect duty errors of the first and second recovered clock signal RCLK0 and RCLK180 to generate the second correction code QEC. The first DCD 660 may provide the first and third sub correction codes CRCD0 and CRCD180 to the first DCC 520, and may provide the second correction code QEC to the second DCC 550.

The second DCD 680 may detect duty errors of the second and fourth propagation clock signals PCLK90 and PCLK270, and may generate second and fourth sub correction codes CRCD90 and CRCD270 based on the detected duty errors. The second DCD 680 may provide the second and fourth sub correction codes CRCD90 and CRCD270 to the first DCC 520.

The timing controller 650 may control operation timings of the first DCD 660, the second DCD 680 and the clock multiplexer 640.

Figure 17:
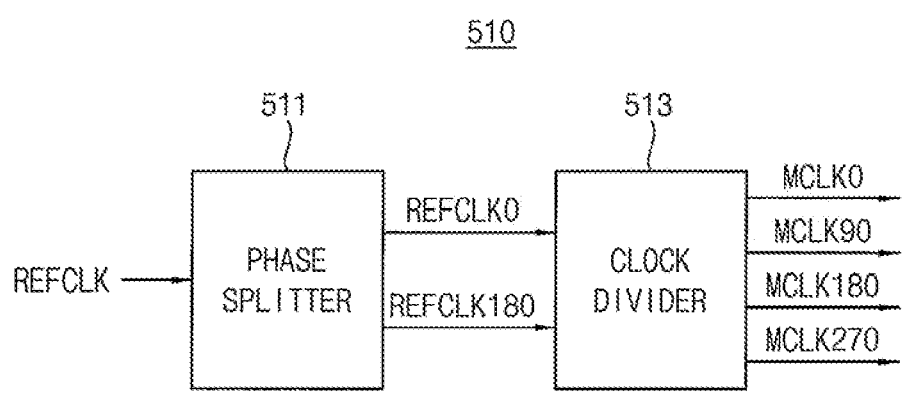
FIG. 17 is a block diagram illustrating an example of the multi-phase clock generator in FIG. 16 according to example embodiments.

FIG. 17 is a block diagram illustrating an example of the multi-phase clock generator in FIG. 16 according to example embodiments.

Referring to FIG. 17, the multi-phase clock generator 510 may include a phase splitter 511 and a clock divider 513.

The phase splitter 511 may split a phase of the reference clock signal REFCLK to output first and second reference clock signals REFCLK0 and REFCLK180, which have a phase difference of 180 degrees. The clock divider 513 may divide the first and second reference clock signals REFCLK0 and REFCLK180 to generate the first through fourth divided clock signals MCLK0, MCLK90, MCLK180, and MCLK270.

Figure 18:
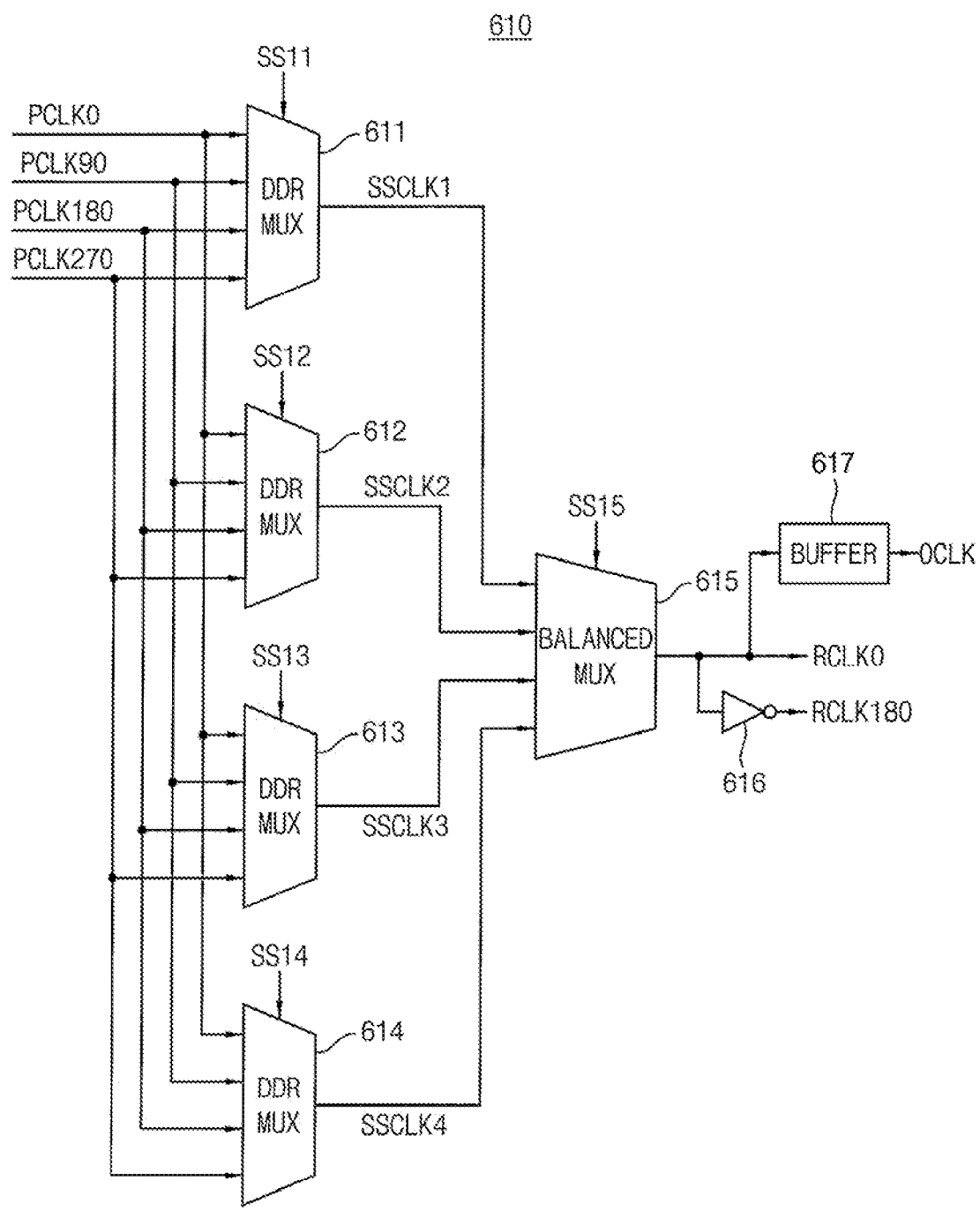
FIG. 18 is a block diagram illustrating an example of the clock recovery circuit in FIG. 16 according to example embodiments.
Figure 19:
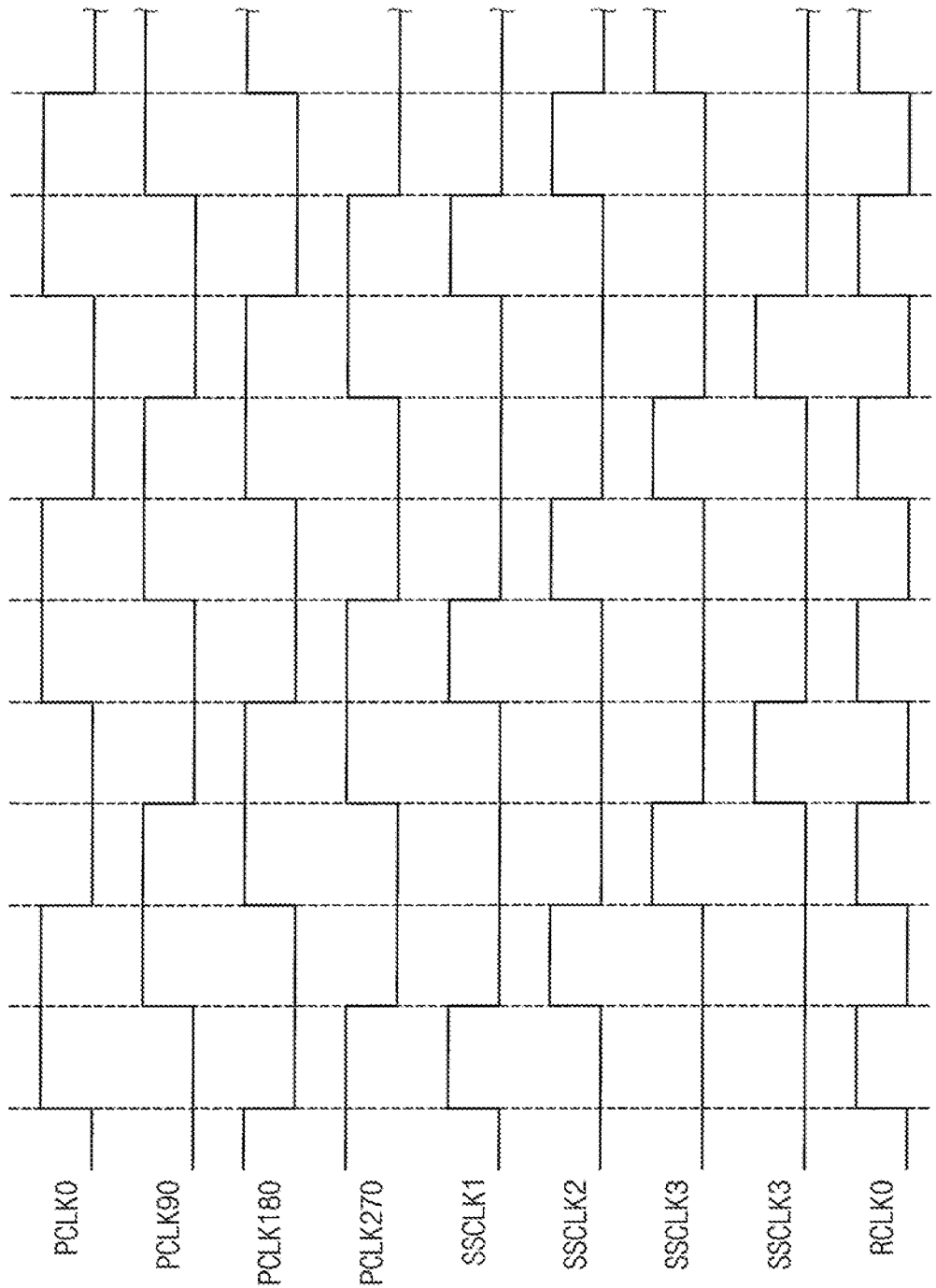
FIG. 19 illustrates an operation of the clock recovery circuit of FIG. 18.

FIG. 18 is a block diagram illustrating an example of the clock recovery circuit in FIG. 16 according to example embodiments. FIG. 19 illustrates an operation of the clock recovery circuit of FIG. 18.

Referring to FIGS. 18 and 19, the clock recovery circuit 610 may include multiplexers 611, 612, 613, 614, and 615, an inverter 616, and a buffer 617.

Each of the multiplexers 611~614 may be a DDR multiplexer. The multiplexer 615 may be a balanced multiplexer. Each of the multiplexers 611~614, in response to selection signals SS11~SS14, may output first through fourth selected clock signals SSCLK1~SSCLK4, respectively, each of which is enabled during a quarter period of each of the first through fourth propagation clock signal PCLK0, PCLK90, PCLK180, and PCLK270. The multiplexer 615 may receive the first through fourth selected clock signals SSCLK1~SSCLK4, and select the first selected clock signal SSCLK1 and the third selected clock signal SSCLK3 alternatingly, in response to a selection signal SS15, to output the first recovered clock signal RCLK0.

The inverter 616 may invert the first recovered clock signal RCLK0 to output the second recovered clock signal RCLK180. The buffer 617 may buffer the first recovered clock signal RCLK0 to output the output clock signal OCLK. The selection signals SS11~SS15 may be included in the second control signal CTL2 in FIG. 2.

Figure 20:
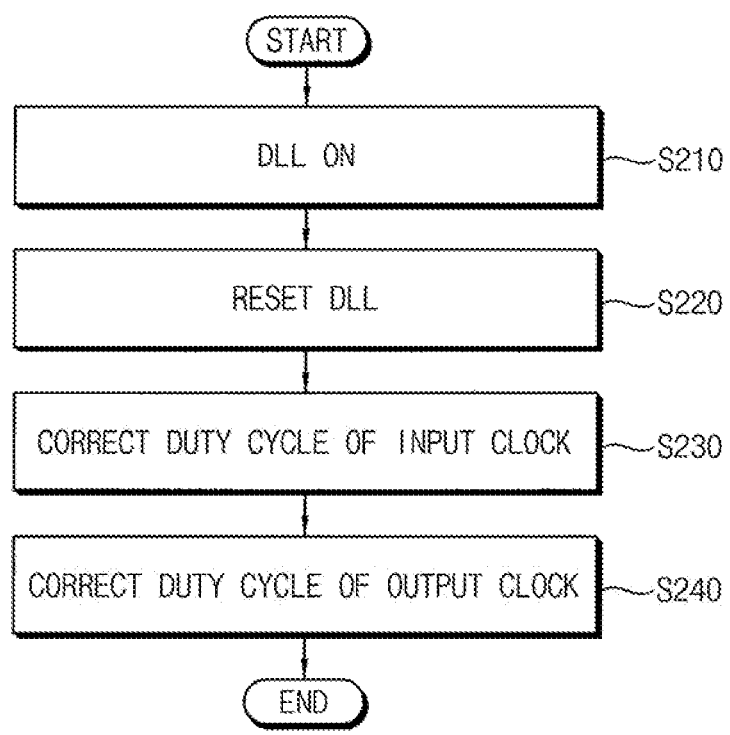
FIG. 20 is a flow chart illustrating an operation of the DLL circuit of FIG. 16 according to example embodiments.

FIG. 20 is a flow chart illustrating an operation of the DLL circuit of FIG. 16 according to example embodiments.

Referring to FIGS. 16 through 20, the DLL circuit 500 is activated (S210). The DLL circuit 500 is reset (S220). The DLL circuit 500 resets the first correction codes CRCD and the second correction code QEC. The first DCC 520 corrects duty errors of the divided clock signals (input clock signals) MCLK0, MCLK90, MCLK180, and MCLK270 in response to the first correction codes CRCD generated based on duty errors of the first through fourth propagation clock signals PCLK0, PCLK90, PCLK180, and PCLK270 (S230). The second DCC 550 corrects duty errors of the delayed clock signals (output clock signals) DCLK0, DCLK90, DCLK180, and DCLK270 based on the second correction code QEC, which is generated based on duty errors of the recovered clock signal RCLK0 and RCLK180. Fast coarse lock may be performed between the operations (S230 and S240).

Figure 21:
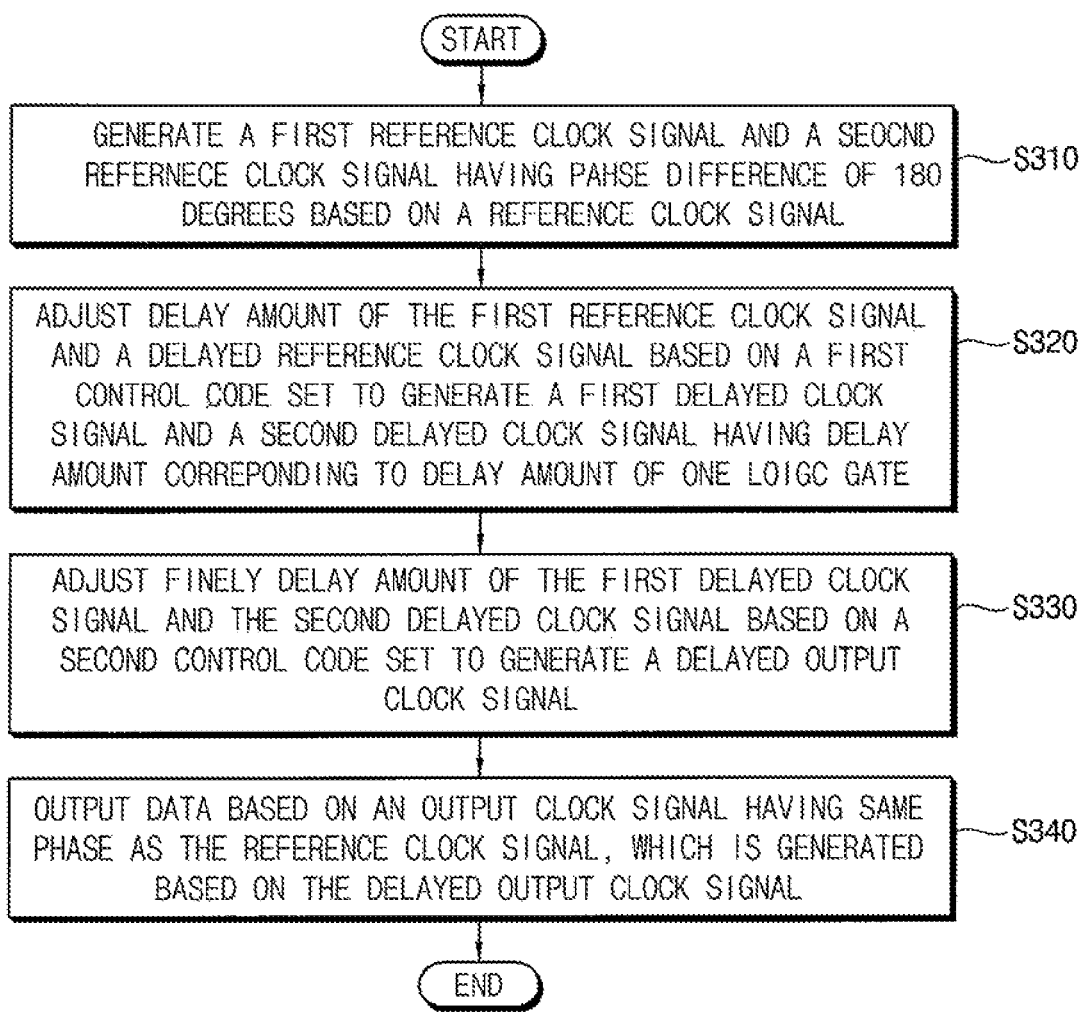
FIG. 21 is a flow chart illustrating an operation of the DLL circuit of FIG. 4 according to example embodiments.

FIG. 21 is a flow chart illustrating an operation of the DLL circuit of FIG. 4 according to example embodiments.

Referring to FIGS. 4 through 15 and 21, in a method of operating a DLL circuit 400, the phase splitter 411 may generate the first reference clock signal REFCLK0=INd and the second reference clock signal REFCLK180=INb having a phase difference of 180 degrees based on the reference clock signal REFCLK (operation S310).

The NAND gate 413 inverts and delays the second reference clock signal INb to output the delayed reference clock signal IND. The plurality of delay cells 420a, 420b, ..., 420k delay the first reference clock signal INd and the delayed reference clock signal IND to generate the first delayed clock signal CLKF and the second delayed clock signal CLKS having a delay amount of one NAND gate, based on the first control code set CDCC (operation S320).

The second delay circuit 450 may finely adjust a delay amount of the first delayed clock CLKF signal and the second delayed clock signal CLKS based on the second control code set FDCC to generate the first delayed output clock signal CLKD1 (operation S330).

The clock pass circuit 471 delays the first delayed output clock signal CLKD1 to generate the output clock signal OCLK having a same phase as a phase of the reference clock signal REFCLK, and provides the output clock signal OCLK to the data I/O buffer 295. The data I/O buffer 295 outputs the data DQ to the memory controller 100 based on the output clock signal OCLK (operation S340).

Accordingly, in the method of operating the DLL circuit 400, the first delay circuit 410 in the DLL circuit 400 may delay the first reference clock signal INd and the delayed reference clock signal IND based on the first control code set CDCC to generate the first delayed clock signal CLKF and the second delayed clock signal CLKS having a delay amount corresponding to a delay amount of one NAND gate, and may decrease a delay amount between the first delayed clock signal CLKF and the second delayed clock signal CLKS. Therefore, the first delay circuit 410 may decrease bang-bang jitter occurring after the coarse lock of the DLL circuit 400.

Figure 22:
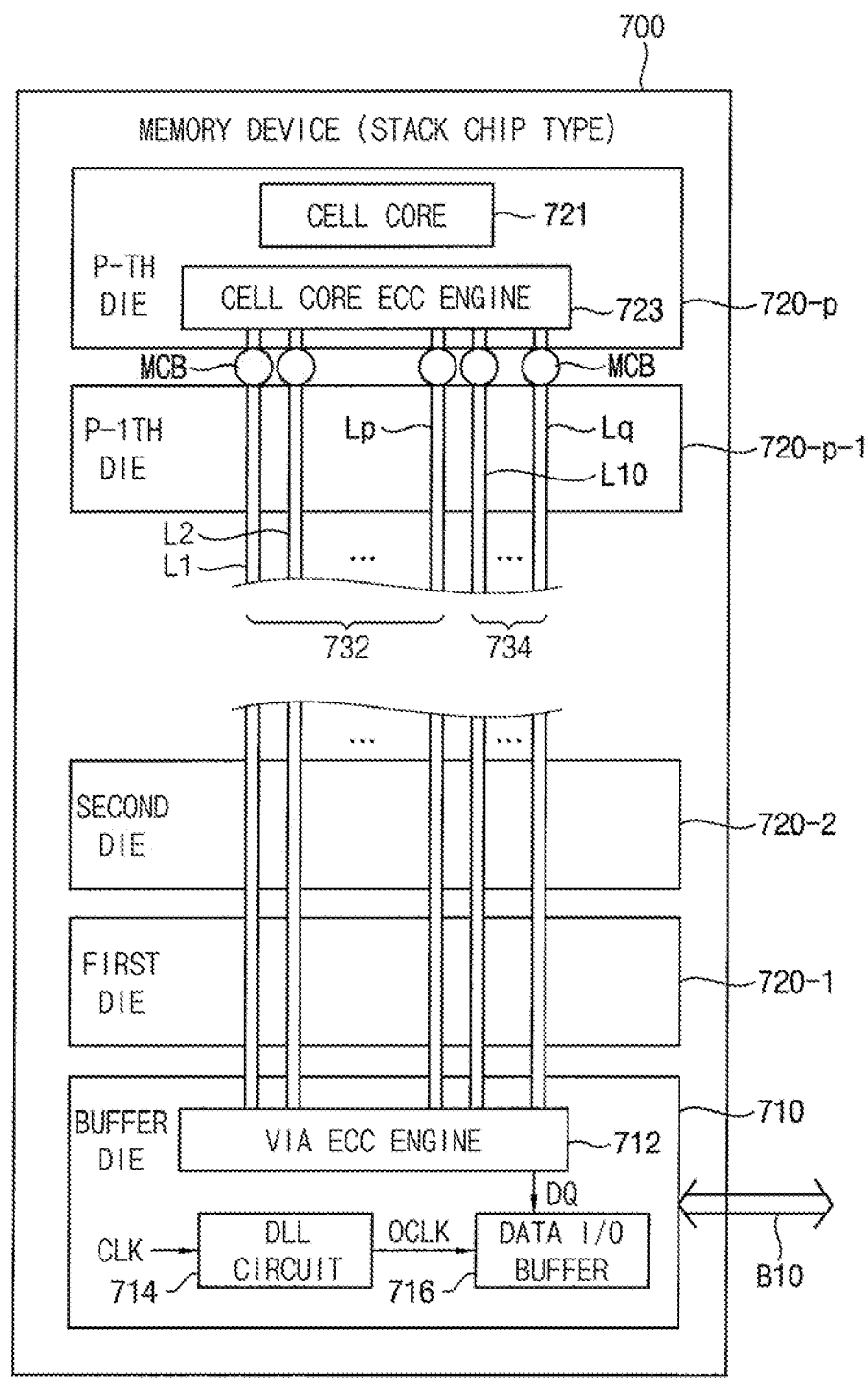
FIG. 22 is a block diagram illustrating a semiconductor memory device according to example embodiments.

FIG. 22 is a block diagram illustrating a semiconductor memory device according to example embodiments.

Referring to FIG. 22, a semiconductor memory device 700 may include at least one buffer die 710 and a plurality of memory dies 720-1 to 720-p (p is a natural number equal to or greater than three) providing a soft error analyzing and correcting function in a stacked chip structure.

The plurality of memory dies 720-1 to 720-p may be stacked on the buffer die 710, and may convey data through a plurality of through silicon via (TSV) lines.

At least one of the memory dies 720-1 to 720-p may include a memory core to store data and a first type ECC engine 722 to generate transmission parity bits (e.g., transmission parity data) based on transmission data to be sent to the at least one buffer die 710. The first type ECC engine 722 may be referred to as 'cell core ECC engine'. The cell core 721 may include a plurality of memory cells having DRAM cell structure.

The buffer die 710 may include a second type ECC engine 712, which may correct a transmission error using the transmission parity bits when a transmission error is detected from the transmission data received through the TSV liens, and generate error-corrected data. The second type ECC engine 712 may be referred to as 'via ECC engine'.

The buffer die 710 may further include a DLL circuit 714 and a data I/O buffer 716. The DLL circuit 714 may employ the DLL circuit 400 of FIG. 4. The DLL circuit 714 may receive a clock signal CLK and provide the data I/O buffer 716 with an output clock signal OCLK that is synchronized with the clock signal CLK. The data I/O buffer 716 may output data DQ from the second type ECC engine 712.

The semiconductor memory device 700 may be, e.g., a stack chip type memory device or a stacked memory device that conveys data and control signals through the TSV lines. The TSV lines may be also called 'through electrodes'.

The first type ECC engine 722 may perform error correction on data that is output from the memory die 720-$p$ before the transmission data is sent.

A transmission error that occurs at the transmission data may be due to, e.g., noise that occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

For example, when the transmission data is 128-bit data, the transmission parity bits may be set to 8 bits. However, the number of transmission parity bits may be increased or decreased.

With the above description, a data TSV line group 732, which is formed at one memory die 720-$p$, may include 128 TSV lines L1 to Lp, and a parity TSV line group 734 may include 8 TSV lines L10 to Lq.

The TSV lines L1 to Lp of the data TSV line group 732 and the parity TSV lines L10 to Lq of the parity TSV line group 734 may be connected to micro bumps MCB, which are correspondingly formed among the memory dies 720-1 to 720-$p$.

At least one of the memory dies 720-1 to 720-$p$ may include DRAM cells, each including at least one access transistor and one storage capacitor.

The semiconductor memory device 700 may have a three-dimensional (3D) chip structure or a 2.5D chip structure to communicate with the host through a data bus B10. The buffer die 710 may be connected with the memory controller through the data bus B10.

The first type ECC engine 722, denoted as the cell core ECC engine, may output transmission parity bits as well as the transmission data through the parity TSV line group 734 and the data TSV line group 732 respectively. The output transmission data may be data that is error-corrected by the first type ECC engine 722.

The second type ECC engine 712, denoted as the via ECC engine, may determine whether a transmission error occurs at the transmission data received through the data TSV line group 732, based on the transmission parity bits received through the parity TSV line group 734. When a transmission error is detected, the second type ECC engine 712 may correct the transmission error on the transmission data using the transmission parity bits. When the transmission error is uncorrectable, the second type ECC engine 712 may output information indicating occurrence of an uncorrectable data error.

When an error is detected from read data in a high bandwidth memory (HBM) or the stacked memory structure, the error may be an error occurring due to noise while data is transmitted through the TSV.

According to example embodiments, as illustrated in FIG. 22, the cell core ECC engine 722 may be included in the memory die, and the via ECC engine 712 may be included in the buffer die. Accordingly, it may be possible to detect and correct soft data fail. The soft data fail may include a transmission error that is generated due to noise when data is transmitted through TSV lines.

Figure 23:
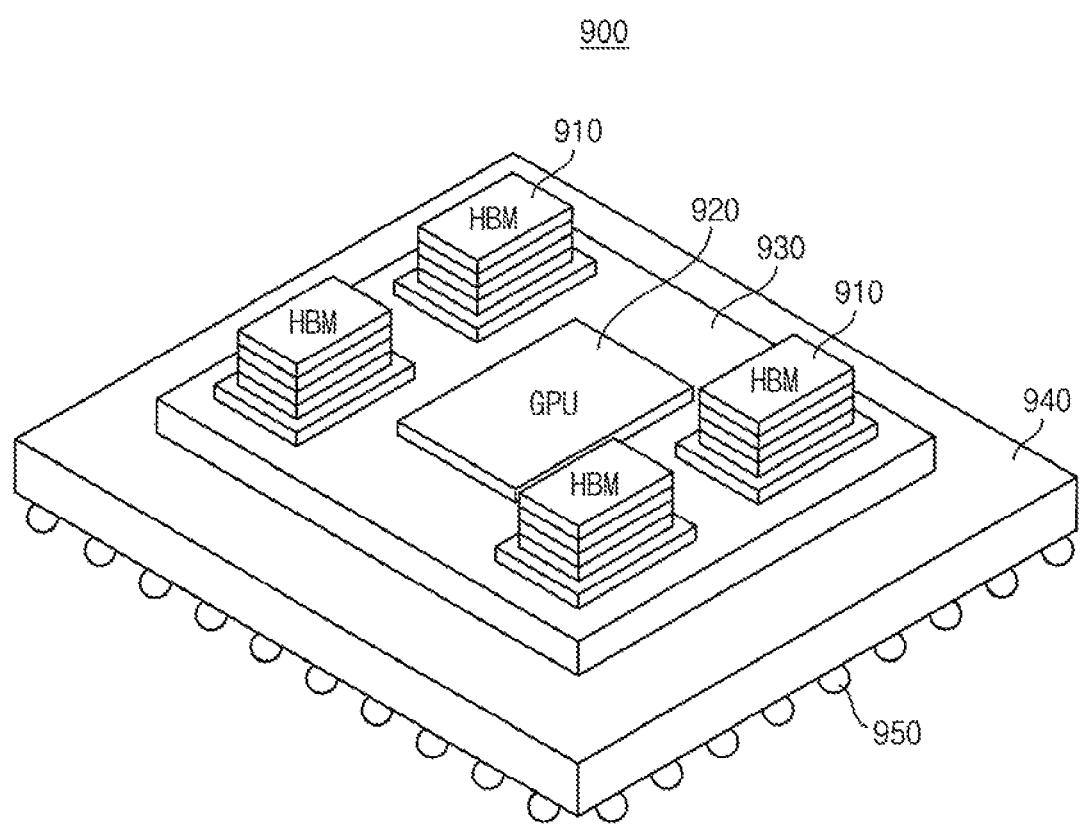
FIG. 23 is a configuration diagram illustrating a semiconductor package including the stacked memory device according to example embodiments.

FIG. 23 is a configuration diagram illustrating a semiconductor package including the stacked memory device according to example embodiments.

Referring to FIG. 23, a semiconductor package 900 may include one or more stacked memory devices 910 and a graphic processing unit (GPU) 920.

The stacked memory devices 910 and the GPU 920 may be mounted on an interposer 930, and the interposer, on which the stacked memory device 910 and the GPU 920 are mounted, may be mounted on a package substrate 940 mounted on solder balls 950.

The GPU 920 may correspond to a semiconductor device that performs a memory control function. For example, the GPU 920 may be implemented as an application processor (AP).

The stacked memory device 910 may be implemented in various forms, and the stacked memory device 910 may be a memory device in a high bandwidth memory (HBM) form, in which a plurality of layers are stacked. Accordingly, the stacked memory device 910 may include a buffer die and a plurality of memory dies, and the buffer die may include a DLL circuit. The plurality of stacked memory devices 910 may be mounted on the interposer 930.

The GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. When the stacked memory device 910 includes a direct access region, a test signal may be provided into the stacked memory device 910 through conductive means (e.g., solder balls 950) mounted under package substrate 940 and the direct access region.

Embodiments may be applied to systems using semiconductor memory devices that employ dynamic memory cells and DLL circuit. For example, embodiments may be applied to systems such as be a smart phone, a navigation system, a notebook computer, a desk top computer, and a game console that use the semiconductor memory device as a working memory.

By way of summation and review, a semiconductor memory device may be classified as a volatile memory device or a nonvolatile memory device. A volatile memory device refers to a memory device that loses data stored therein at power-off. As an example of a volatile memory device, a dynamic random access memory (DRAM) may be used in various devices such as a mobile system, a server, or a graphic device. The semiconductor memory device may operate in synchronization with a clock applied from the outside. When the externally applied clock is used in the semiconductor memory device, a time delay (or a clock skew) may occur due to an internal circuit of the semiconductor memory device. A delay-locked loop (DLL) may be used to compensate for the time delay. The delay locked loop may synchronize the semiconductor memory device with the externally applied clock. The DLL may perform a locking operation for the purpose of synchronizing a phase of an input clock signal and a phase of a delayed output clock signal.

As described above, embodiments may provide a delay circuit of a delay-locked loop (DLL) circuit, capable of increasing delay resolution. Embodiments may also provide a DLL circuit including a delay circuit capable of increasing delay resolution.

A delay circuit (coarse delay line) in the DLL circuit according to example embodiments may delay the first reference clock signal and the delayed reference clock signal based on the first control code set to generate the first delayed clock signal and the second delayed clock signal having a delay amount corresponding to a delay amount of one gate, and may decrease a delay amount between the first delayed clock signal and the second delayed clock signal. Therefore, the delay circuit may decrease bang-bang jitter which occurs after the coarse lock of the DLL circuit.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A delay circuit of a delay-locked loop (DLL) circuit, the delay circuit comprising:
   a phase splitter configured to split a phase of a reference clock signal to output a first reference clock signal and a second reference clock signal having a phase difference of 180 degrees;
   a logic gate configured to delay the second reference clock signal to output a delayed reference clock signal; and
   a delay line circuit including a plurality of delay cells that are cascade-connected, the delay line circuit configured to delay the first reference clock signal and the delayed reference clock signal based on a control code set, and to output a first delayed clock signal and a second delayed clock signal having a delay amount corresponding to a delay of one logic gate included in the plurality of delay cells.

2. The delay circuit as claimed in claim 1, wherein the plurality of delay cells include:
   first through k-th delay cells that are cascaded-connected in series, each of the first through k-th delay cells having a same configuration, k being a natural number equal to or greater than three,
   wherein the first delay cell is configured to determine a sub-delay amount of the first reference clock signal and the delayed reference clock signal, and to determine whether to transfer the first reference clock signal and the delayed reference clock signal to the second delay cell based on a first control code of the control code set.

3. The delay circuit as claimed in claim 2, wherein:
   the first delay cell includes first through twelfth NAND gates,
   the first NAND gate performs a NAND operation on the first reference clock signal and a first selection control bit in the first control code,
   the second NAND gate performs a NAND operation on the first reference clock signal and a first transfer control bit in the first control code,
   the third NAND gate performs a NAND operation on the delayed reference clock signal and the first transfer control bit,
   the fourth NAND gate performs a NAND operation on the delayed reference clock signal and a second selection control bit in the first control code,
   the fifth NAND gate performs a NAND operation on an output of the second NAND gate and a third selection control bit in the first control code,
   the sixth NAND gate performs a NAND operation on the output of the second NAND gate and a second transfer control bit in the first control code and provides the second delay cell with a result of the NAND operation of the sixth NAND gate,
   the seventh NAND gate performs a NAND operation on an output of the third NAND gate and the second transfer control bit and provides the second delay cell with a result of the NAND operation of the seventh NAND gate,
   the eighth NAND gate performs a NAND operation on the output of the third NAND gate and a fourth selection control bit in the control code,
   the ninth NAND gate performs a NAND operation on an output of the fifth NAND gate and a first transfer signal from the second delay cell,
   the tenth NAND gate performs a NAND operation on an output of the seventh NAND gate and a second transfer signal from the second delay cell,
   the eleventh NAND gate performs a NAND operation on an output of the first NAND gate and an output of the ninth NAND gate to output the first delayed clock signal, and
   the twelfth NAND gate performs a NAND operation on an output of the fourth NAND gate and an output of the tenth NAND gate to output the second delayed clock signal.

4. The delay circuit as claimed in claim 3, wherein the first NAND gate, the fourth NAND gate, the fifth NAND gate, and the eighth NAND gate are configured to determine the sub-delay amount based on the first through fourth selection control bits.

5. The delay circuit as claimed in claim 3, wherein the sixth NAND gate and the seventh NAND gate are configured to selectively transfer the first reference clock signal and the delayed reference clock signal to the second delay cell based on the second transfer control bit, respectively.

6. The delay circuit as claimed in claim 1, wherein the logic gate configured to delay the second reference clock signal includes a NAND gate configured to perform a NAND operation on a power supply voltage and the second reference clock signal, and to output the delayed reference clock signal.

7. The delay circuit as claimed in claim 1, wherein the delay amount between the first delayed clock signal and the second delayed clock signal is substantially the same as a delay amount between the first reference clock signal and the delayed reference clock signal.

8. The delay circuit as claimed in claim 1, wherein the second delayed clock signal has a phase that is delayed by the delay amount with respect to a phase of the first delayed clock signal.

9. A delay-locked loop (DLL) circuit of a semiconductor memory device, the DLL circuit comprising:
a first delay circuit configured to delay a reference clock signal based on a first control code set to generate a first delayed clock signal and a second delayed clock signal;
a second delay circuit configured to finely adjust a delay amount of the first delayed clock signal and the second delayed clock signal based on a second control code set to generate a first delayed output clock signal;
a clock pass circuit configured to delay the first delayed output clock signal to generate an output clock signal having a same phase as a phase of the reference clock signal;
a replica circuit configured to delay the first delayed output clock signal to generate a feedback clock signal; and
a first delay controller configured to adjust code values of the first control code set based on a first phase difference between the reference clock signal and the feedback clock signal, detected during a first interval, and configured to provide the first control code set to the first delay circuit;
wherein the first delay circuit includes:
a phase splitter configured to split a phase of the reference clock signal to output a first reference clock signal and a second reference clock signal having a phase difference of 180 degree;
a logic gate configured to delay the second reference clock signal to output a delayed reference clock signal; and
a delay line circuit including a plurality of delay cells that are cascade-connected, the delay line circuit configured to delay the first reference clock signal and the delayed reference clock signal based on the first control code set, and to output the first delayed clock signal and the second delayed clock signal having a delay amount corresponding to a delay of one logic gate included in the plurality of delay cells.

10. The DLL circuit as claimed in claim 9, wherein the plurality of delay cells include:
first through k-th delay cells that are cascaded-connected in series, each of the first through k-th delay cells having a same configuration, k being a natural number equal to or greater than three,
wherein the first delay cell is configured to determine a sub-delay amount of the first reference clock signal and the delayed reference clock signal, and to determine whether to transfer the first reference clock signal and the delayed reference clock signal to the second delay cell based on a first control code of the control code set.

11. The DLL circuit as claimed in claim 10, wherein:
the first delay cell includes first through twelfth NAND gates,
the first NAND gate performs a NAND operation on the first reference clock signal and a first selection control bit in the first control code,
the second NAND gate performs a NAND operation on the first reference clock signal and a first transfer control bit in the first control code,
the third NAND gate performs a NAND operation on the delayed reference clock signal and the first transfer control bit,
the fourth NAND gate performs a NAND operation on the delayed reference clock signal and a second selection control bit in the first control code,
the fifth NAND gate performs a NAND operation on an output of the second NAND gate and a third selection control bit in the first control code,
the sixth NAND gate performs a NAND operation on the output of the second NAND gate and a second transfer control bit in the first control code and provides the second delay cell with a result of the NAND operation of the sixth NAND gate,
the seventh NAND gate performs a NAND operation on an output of the third NAND gate and the second transfer control bit and provides the second delay cell with a result of the NAND operation of the seventh NAND gate,
the eighth NAND gate performs a NAND operation on the output of the third NAND gate and a fourth selection control bit in the control code,
the ninth NAND gate performs a NAND operation on an output of the fifth NAND gate and a first transfer signal from the second delay cell,
the tenth NAND gate performs a NAND operation on an output of the seventh NAND gate and a second transfer signal from the second delay cell,
the eleventh NAND gate performs a NAND operation on an output of the first NAND gate and an output of the ninth NAND gate to output the first delayed clock signal, and
the twelfth NAND gate performs a NAND operation on an output of the fourth NAND gate and an output of the tenth NAND gate to output the second delayed clock signal.

12. The DLL circuit as claimed in claim 11, wherein:
the first NAND gate, the fourth NAND gate, the fifth NAND gate, and the eighth NAND gate are configured to determine the sub-delay amount based on the first through fourth selection control bits; and
the sixth NAND gate and the seventh NAND gate are configured to selectively transfer the first reference clock signal and the delayed reference clock signal to the second delay cell based on the second transfer control bit, respectively.

13. The DLL circuit as claimed in claim 9, further comprising a second delay controller configured to adjust code values of the second control code set based on a second phase difference between the reference clock signal and the feedback clock signal, detected during a second interval different from the first interval, and configured to provide the second control code set to the second delay circuit.

14. The DLL circuit as claimed in claim 13, further comprising:
a first phase detector configured to detect the first phase difference during the first interval and configured to provide the first delay controller with a first up/down signal corresponding to the first phase difference, in response to a first enable signal;
a second phase detector configured to detect the second phase difference during the second interval and configured to provide the second delay controller with a second up/down signal corresponding to the second phase difference, in response to a second enable signal; and
a DLL circuit control logic configured to determine logic levels of the first enable signal and the second enable signal based on an initializing enable signal.

15. The DLL circuit as claimed in claim 14, wherein the first phase detector is configured to provide the DLL control logic with an end signal indicating an ending of an adjusting operation of the first delay controller in response to a predetermined time interval elapsing.

16. The DLL circuit as claimed in claim 15, wherein the DLL control logic is configured to deactivate the first enable signal and configured to activate the second enable signal, in response to the end signal.

17. The DLL circuit as claimed in claim 9, wherein the second delay circuit includes:
   a delayed clock signal generator configured to delay the first delayed clock signal and the second delayed clock signal to generate first through third sub-delayed clock signals; and
   a phase interpolator block configured to adjust finely delay amounts of the first through third sub-delayed clock signals based on the second control code set to output the first delayed output clock signal.

18. The DLL circuit as claimed in claim 17, wherein the phase interpolator block includes a plurality of phase interpolators, which are configured to adjust of a slope of an edge of each of the first through third sub-delayed clock signals based on the second control code set.

19. The DLL circuit as claimed in claim 17, wherein the replica circuit includes:
   a clock pass replica circuit configured to provide a delay amount that is the same as a delay amount of a clock buffer to output the reference clock signal by buffering a clock signal; and
   a data pass replica circuit configured to provide a delay amount that is the same as a delay amount of a data input/output buffer, which outputs data in response to the output clock signal.

20. A delay circuit of a delay-locked loop (DLL) circuit, the delay circuit comprising:
   a phase splitter configured to split a phase of a reference clock signal to output a first reference clock signal and a second reference clock signal having a phase difference of 180 degree;
   a logic gate configured to delay the second reference clock signal to output a delayed reference clock signal; and
   a delay line circuit including a plurality of delay cells that are cascaded-connected, the delay line circuit configured to delay the first reference clock signal and the delayed reference clock signal based on a control code set, and to output a first delayed clock signal and a second delayed clock signal having a delay amount corresponding to a delay of one logic gate included in the plurality of delay cells, wherein:
   the plurality of delay cells include first through k-th delay cells that are cascade-connected in series, each of the first through k-th delay cells having a same configuration, k being a natural number equal to or greater than two,
   the first delay cell is configured to determine a sub-delay amount of the first reference clock signal and the delayed reference clock signal, and to determine whether to transfer the first reference clock signal and the delayed reference clock signal to the second delay cell based on a first control code of the control code set, and
   each of the first through k-th delay cells includes first through twelfth NAND gates, and are configured to adjust the delay amount between the first delayed clock signal and the second delayed clock signal to be the same as a delay amount between the first reference clock signal and the delayed reference clock signal.

* * * * *